United States Patent
Zhu et al.

(10) Patent No.: US 10,840,233 B2
(45) Date of Patent: *Nov. 17, 2020

(54) RADIO-FREQUENCY SWITCH HAVING STACK OF NON-UNIFORM ELEMENTS

(71) Applicant: SKYWORKS SOLUTIONS, INC., Woburn, MA (US)

(72) Inventors: Yu Zhu, Wellesley, MA (US); David Scott Whitefield, Andover, MA (US); Ambarish Roy, Waltham, MA (US); Guillaume Alexandre Blin, Carlisle, MA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/299,879

(22) Filed: Mar. 12, 2019

(65) Prior Publication Data

US 2019/0273076 A1    Sep. 5, 2019

Related U.S. Application Data

(63) Continuation of application No. 15/666,147, filed on Aug. 1, 2017, now Pat. No. 10,229,902, which is a (Continued)

(51) Int. Cl.
*H01L 27/088* (2006.01)
*H01L 27/02* (2006.01)
*H01L 27/12* (2006.01)

(52) U.S. Cl.
CPC ...... *H01L 27/0207* (2013.01); *H01L 27/1203* (2013.01); *H01L 2224/05554* (2013.01);
(Continued)

(58) Field of Classification Search
CPC ............. H01L 27/0207; H01L 27/1203; H01L 29/42376
See application file for complete search history.

(56) References Cited

U.S. PATENT DOCUMENTS 4,962,341 A    10/1990  Schoeff
6,642,578 B1   11/2003  Arnold et al.
(Continued)

FOREIGN PATENT DOCUMENTS

JP    2005-203643 A    7/2005
JP    2008-011320 A    1/2008
(Continued)

OTHER PUBLICATIONS

V.M. Srivastava and G. Singh, Effect of gate finger on double gate MOSFET for RF switch at 45-nm technology, 2011, IEEE Computer Society, 2011 International Conference, pp. 464-468.
(Continued)

*Primary Examiner* — Stephen M Bradley
*Assistant Examiner* — Wasiul Haider
(74) *Attorney, Agent, or Firm* — Chang & Hale LLP

(57) ABSTRACT

A switch fabrication method can include forming a plurality of elements, and connecting the elements in series between a first terminal and a second terminal, such that the elements include a first end element connected to the first terminal and a second end element connected to the second terminal. Each element can have a parameter such that the elements have a distribution of parameter values that decreases from the first end element for at least half of the elements to a minimum parameter value corresponding to an element between the first end element and the second end element. The minimum parameter value can be less than the parameter value of the second end element, and the parameter (Continued)

value of the first end element can be greater than or equal to the parameter value of the second end element.

20 Claims, 18 Drawing Sheets

Related U.S. Application Data continuation of application No. 14/451,321, filed on Aug. 4, 2014, now Pat. No. 9,721,936.

(60) Provisional application No. 61/863,043, filed on Aug. 7, 2013.

(52) U.S. Cl.
CPC ............... *H01L 2224/48091* (2013.01); *H01L 2224/48227* (2013.01); *H01L 2924/13091* (2013.01); *H01L 2924/15184* (2013.01); *H01L 2924/15192* (2013.01); *H01L 2924/181* (2013.01)

(56) References Cited

U.S. PATENT DOCUMENTS

| | | | |
|---|---|---|---|
| 8,432,016 | B1 | 4/2013 | Kerr |
| 8,896,034 | B1 | 11/2014 | Vorhaus |
| 10,229,902 | B2 * | 3/2019 | Zhu ..................... H01L 27/1203 |
| 2006/0160520 | A1 | 7/2006 | Miyazawa |
| 2008/0157222 | A1 | 7/2008 | Wang |
| 2011/0029266 | A1 | 2/2011 | Lee |
| 2011/0294445 | A1 | 12/2011 | Goto et al. |
| 2012/0197593 | A1 | 8/2012 | Guo et al. |
| 2012/0280713 | A1 | 11/2012 | Katoh |
| 2013/0072134 | A1 | 3/2013 | Goto et al. |
| 2013/0115895 | A1 | 5/2013 | Crandall |
| 2013/0134018 | A1 | 5/2013 | Aimi |
| 2013/0193512 | A1 | 8/2013 | Weis |
| 2014/0103434 | A1 | 4/2014 | Lu |

FOREIGN PATENT DOCUMENTS

| | | |
|---|---|---|
| JP | 2009-117445 A | 5/2009 |
| JP | 2010-527179 A | 8/2010 |
| JP | 2011-249466 A | 12/2011 |
| WO | 2008133621 A | 11/2008 |

OTHER PUBLICATIONS

Rong Zhou et al., "Novel Type of Base-Combed RF Power Transistors," Chinese Journal of Semiconducors, vol. 22 No. 9, Sep. 2001, Chengdu, China.

\* cited by examiner

RADIO-FREQUENCY SWITCH HAVING STACK OF NON-UNIFORM ELEMENTS

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57. This application is a continuation of U.S. application Ser. No. 15/666,147 filed Aug. 1, 2017, entitled STACK DEVICE HAVING VOLTAGE COMPENSATION, which is a continuation of U.S. application Ser. No. 14/451,321 filed Aug. 4, 2014, entitled FIELD-EFFECT TRANSISTOR STACK VOLTAGE COMPENSATION, which claims priority to and the benefit of the filing date of U.S. Provisional Application No. 61/863,043 filed Aug. 7, 2013, entitled FIELD-EFFECT TRANSISTOR STACK VOLTAGE COMPENSATION, the benefits of the filing dates of which are hereby claimed and the disclosures of which are hereby expressly incorporated by reference herein in their entirety.

BACKGROUND

Field

The present disclosure generally relates to radio-frequency (RF) switches based on stacks of switching elements such as field-effect transistors (FETs).

Description of the Related Art

In some radio-frequency (RF) applications, an RF switch can include a plurality of switching elements, such as field-effect transistors (FETs), arranged in a stack configuration. Such a stack configuration can facilitate, for example, handling of power by the RF switch. Typically, an RF switch having a higher FET stack height can handle higher power.

SUMMARY

In accordance with some implementations, the present disclosure relates to a switching device that includes a first terminal and a second terminal. The switching device further includes a plurality of switching elements connected in series between the first and terminal and the second terminal. Each switching element has a parameter that is configured to yield a desired voltage drop profile among the connected switching elements.

In some embodiments, each of the plurality of switching elements can include a diode. In such embodiments, the parameter can include a junction area. The parameter can also include a number of parallel-diodes that yield the diode of the switching element.

In some embodiments, each of the plurality of switching elements can include a field-effect transistor (FET) having an active region, and a source contact, a drain contact and a gate formed on the active region. The FET can be, for example, a metal-oxide-semiconductor FET (MOSFET). The FET can be implemented as a silicon-on-insulator (SOI) device. In some embodiments, the parameter can include a width of the gate. In some embodiments, the parameter can include a number of fingers associated with the gate.

In some embodiments, the FET can be implemented as a finger configuration device such that the gate includes a number of rectangular shaped gate fingers. Each gate finger can be implemented between a rectangular shaped source finger of the source contact and a rectangular shaped drain finger of the drain contact. The width of the gate can be a dimension corresponding to an overlap between the gate fingers and the active region.

In some embodiments, the desired voltage drop profile can be approximately uniform among the connected switching elements. In some embodiments, the first terminal can be an input terminal and the second terminal can be an output terminal. The switching device can be a radio-frequency (RF) switching device.

In some embodiments, the plurality of switching elements can be configured to provide bi-directional functionality. Either of the first terminal and the second terminal can be an input terminal, and the other terminal can be an output terminal.

In some implementations, the present disclosure relates to a radio-frequency (RF) switching device implemented as a stack of field-effect transistors (FETs). The stack includes a plurality of FETs connected in series, with each FET having an active region, a source contact formed on the active region, a drain contact formed on the active region, and a gate formed on the active region. The stack further includes at least some of the FETs having gates with respective variable-dimensions.

In some embodiments, the variable-dimensions can be selected to yield a desirable voltage drop profile for the respective FETs. The desirable voltage drop profile can include an approximately uniform distribution of voltage drops associated with the respective FETs.

In some embodiments, the variable-dimensions can include variable widths of the respective gates. The variable gate width can change monotonically between first and second ends of the connected FETs. The first and second ends of the connected FETs can be configured as an input and an output, respectively, and the variable gate width can decrease monotonically from the input to the output.

In some embodiments, the variable-dimensions can include variable numbers of gate fingers associated with the respective gates.

In a number of teachings, the present disclosure relates to a semiconductor die that includes a semiconductor substrate. The die further includes a plurality of field-effect transistors (FETs) formed on the semiconductor substrate, with the FETs being connected in series. Each FET includes an active region, a source contact formed on the active region, a drain contact formed on the active region, and a gate formed on the active region. At least some of the FETs have gates with respective variable-dimensions.

According to some implementations, the present disclosure relates to a radio-frequency (RF) switching module that includes a packaging substrate configured to receive a plurality of components. The RF switching module further includes a die mounted on the packaging substrate. The die has a switching circuit, and the switching circuit includes a plurality of field-effect transistors (FETs) connected in series. Each FET has an active region, a source contact formed on the active region, a drain contact formed on the active region, and a gate formed on the active region. At least some of the FETs have gates with respective variable-dimensions.

In some implementations, the present disclosure relates to a wireless device that includes a transmitter and a power amplifier in communication with the transmitter. The power amplifier is configured to amplify an RF signal generated by the transmitter. The wireless device further includes an antenna configured to transmit the amplified RF signal. The wireless device further includes a switching circuit configured to route the amplified RF signal from the power amplifier to the antenna. The switching circuit including a plurality of switching elements connected in series. Each switching element has a parameter that is configured to yield a desired voltage drop profile among the connected switching elements.

In a number of implementations, the present disclosure relates to an electronic device having a stack configuration. The device includes a first terminal and a second terminal. The device further includes a plurality of elements connected in series between the first terminal and the second terminal. Each element has a capacitance to yield a desired distribution of capacitance values among the elements.

In some embodiments, the desired distribution can include a substantially uniform distribution. In some embodiments, each of the plurality of elements can include a diode. In some embodiments, each of the plurality of elements can include a field-effect transistor (FET) having an active region, and a source contact, a drain contact and a gate formed on the active region. The capacitance of each FET can be selected based on a width of the gate of the FET. The capacitance of each FET can be selected based on a number of fingers associated with the gate of the FET. The device can be, for example, a radio-frequency (RF) switching device.

In some embodiments, each of the plurality of elements can include a microelectromechanical systems (MEMS) device. The capacitance of each MEMS device can be selected based on a contact area associated with the MEMS device. The capacitance of each MEMS device can be selected based on a number of parallel-MEMS devices that yield the MEMS device.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

In some radio-frequency (RF) applications, an RF switch can include a plurality of switching elements, such as field-effect transistors (FETs), arranged in a stack configuration. Such a stack configuration can facilitate, for example, appropriate handling of power. For example, a higher FET stack height can withstand higher power under, for example, a mismatch condition. RF applications that utilize such RF switches can include, for example, antenna tuning or some other switching applications involving passive components (e.g., in matching networks).

Elements of an FET stack can yield their intrinsic passive capacitance or resistance behaviors in their OFF or ON states, respectively, and such behaviors are typically relatively well maintained with varying input power. However, uneven voltage distribution across the FET stack can lead to undesirable effects such as harmonic peaking, degradation in compression point and/or intermodulation distortion (IMD) of the switch. Such effects can be manifested in switch designs that utilize silicon-on-insulator (SOI) technology. For example, coupling between the FET stack and ground can result in a decrease in an RF current inside the stack, from a power input side to an output side. Such an uneven current inside each FET in the stack typically leads to an uneven voltage drop across the FETs in the stack. Such an uneven current can also result in a reduced power voltage handling capability of the stack itself, where the individual FET which handles the most voltage breaks down at some power level.

Described herein are devices and methods that can be implemented to reduce such an uneven voltage distribution across an FET stack. Although described in the context of FET stacks, it will be understood that one or more features of the present disclosure can also be implemented in switching stacks that utilize other types of switching elements. For example, switching stacks having diodes or microelectromechanical systems (MEMS) devices (e.g., MEMS capacitors or MEMS switches) as switching elements can also benefit from implementation of one or more features as described herein.

Figure 1:
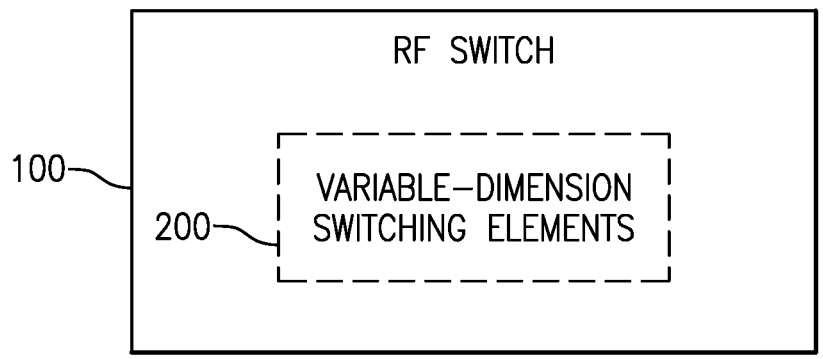
FIG. 1 depicts a radio-frequency (RF) switch having variable-dimension switching elements.

FIG. 1 schematically shows an RF switch 100 having variable-dimension switching elements (collectively indicated as 200). For the purpose of description, it will be understood that some or all of the switching elements can have different dimensions. It will also be understood that variable-dimension and variable-geometry can be used interchangeably in the description herein. Such variable-dimension/variable-geometry can include, for example, different sizes, different shapes, different configurations, or some combination thereof, of one or more parts associated with the switching elements. In some implementations, such one or more parts associated with the switching elements can include one or more parts (or some combination thereof) that are inherent to the switching elements. In such implementations, one can see that advantageous features provided by such variable-dimensions of the inherent part(s) of the switching elements can be beneficial, since additional external components are not necessarily needed.

Figure 2A:
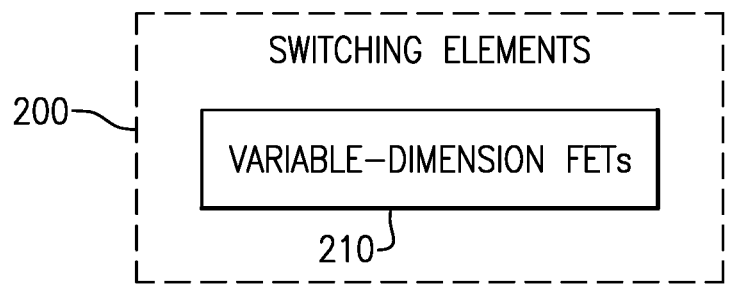
FIG. 2A shows that in some embodiments, the switching elements of FIG. 1 can include variable-dimension field-effect transistors (FETs).
Figure 2B:
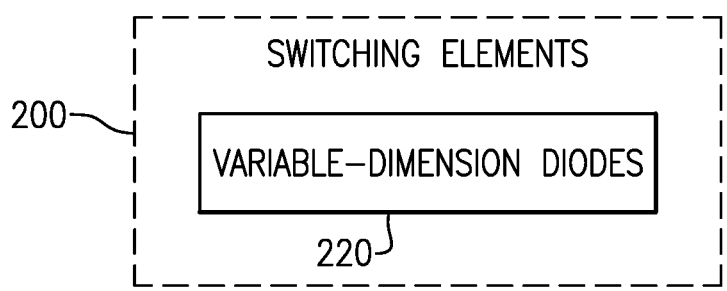
FIG. 2B shows that in some embodiments, the switching elements of FIG. 1 can include variable-dimension diodes.
Figure 2C:
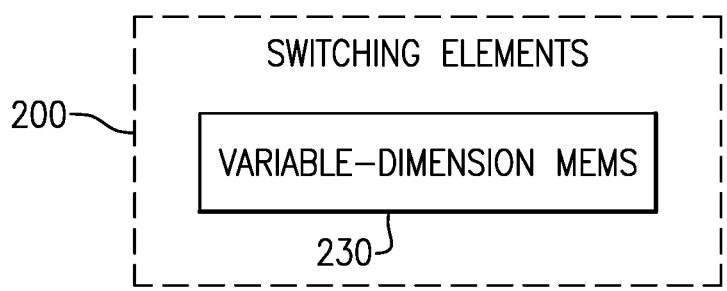
FIG. 2C shows that in some embodiments, the switching elements of FIG. 1 can include variable-dimension MEMS devices.

FIGS. 2A-2C show non-limiting examples of switching elements 200 having one or more features of the present disclosure. FIG. 2A shows that in some embodiments, switching elements or stack elements 200 can include variable-dimension field-effect transistors (FETs) 210. For the purpose of description, it will be understood that such FETs can include, for example, metal-oxide-semiconductor FETs (MOSFETs) such as SOI MOSFETs. It will also be understood that FETs as described herein can be implemented in other process technologies, including but not limited to HEMT, SOI, silicon-on-sapphire (SOS), and CMOS technologies.

FIG. 2B shows that in some embodiments, switching elements or stack elements 200 can include variable-dimension diodes 220. For the purpose of description, it will be understood that such diodes can include, for example, FET-based diodes.

FIG. 2C shows that in some embodiments, switching elements or stack elements 200 can include variable-dimension MEMS devices 230. For the purpose of description, it will be understood that such MEMS devices can include, for example, MEMS capacitors and other MEMS devices that utilize similar metal routing layouts as described herein. In the example context of MEMS capacitors, such capacitors can be utilized in, for example, a capacitor stack in a high-power varactor device.

Figure 3:
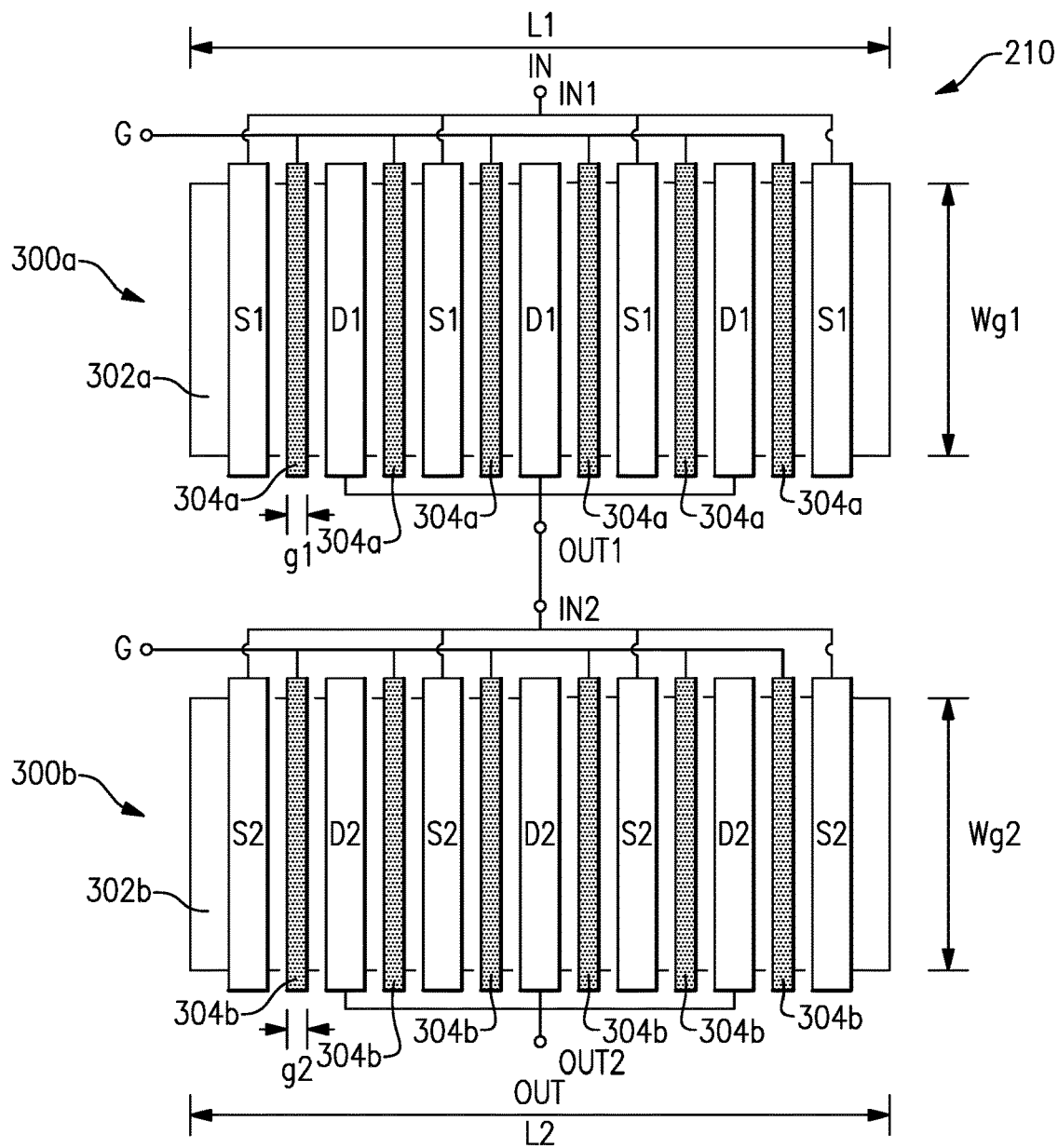
FIG. 3 shows an example stack having a plurality of FETs electrically connected in series.

FIG. 3 shows an example stack 210 having a plurality of FETs electrically connected in series. Although two example FETs (300a, 300b) are shown, it will be understood that such a stack can include other numbers of FETs. In the example, a first example FET 300a is shown to include an active region 302a having a dimension of length L1 and width Wg1. Although described in the example context of a rectangular shape, it will be understood that other shapes of active region are also possible. Further, it will be understood that, although various examples are described herein in the context of finger configurations, other configurations of source, drain and/or gate can also be implemented.

A plurality of source (S1) and drain (D1) contacts are shown to be implemented in a finger configuration, with gate fingers (304a, with gate length g1) interleaved therebetween. In some embodiments, each of the source and drain contacts (S1, D1) can form an ohmic metal contact with the active region 302a, and each of the gate fingers 304a can include a metal contact coupled with the active region 302a through a gate oxide layer. Each of the source contacts S1 can be electrically connected to a first input node In1, and each of the drain contacts D1 can be electrically connected to a first output node Out1. It will be understood that each of S1 and D1 can be either an input or output, depending on a given layout. Each of the gates 304a can be electrically connected to a gate node G. Operation of such an FET as a switch element (e.g., by turning it ON or OFF by application of appropriate gate signals) can be implemented in known manners.

A second example FET 300b is shown to include an active region 302b having a dimension of length L2 and width Wg2. A plurality of source (S2) and drain (D2) contacts are shown to be implemented in a finger configuration, with gate fingers (304b, with gate length g2) interleaved therebetween. In some embodiments, each of the source and drain contacts (S2, D2) can form an ohmic metal contact with the active region 302b, and each of the gate fingers 304b can include a metal contact coupled with the active region 302b through a gate oxide layer. Each of the source contacts S2 can be electrically connected to a second input node In2, and each of the drain contacts D2 can be electrically connected to a first output node Out2. It will be understood that each of S2 and D2 can be either an input or output, depending on a given layout. Each of the gates 304b can be electrically connected to a gate node G. Operation of such an FET as a switch element (e.g., by turning it ON or OFF by application of appropriate gate signals) can be implemented in known manners.

In the example stack 210, the output (Out1) of the first FET 300a can be electrically connected to the input (In2) of the second FET 300b. Accordingly, the input (In1) of the first FET 300a can function as an input (IN) of the stack 210, and the output (Out2) of the second FET 300b can function as an output (OUT) of the stack 210. In some embodiments, the gate nodes of the first and second FETs 300a, 300b can be controlled together, independently, and any combination thereof.

For the purpose of description, a gate width can include a dimension associated with an overlap between a gate and its corresponding active region. Thus, in the example shown in FIG. 3, such a gate width can be represented by Wg1 for the first FET 300a, and Wg2 for the second FET 300b.

In some embodiments, one or more of the example FET parameters such as active region length (e.g., L1, L2), gate with (e.g., Wg1, Wg2), gate length (e.g., g1, g2) can be different among at least some of the FETs in a stack. In the context of the active region length, variation in such an FET parameter can be implemented by, for example, different numbers of source-gate-drain units, length dimension (horizontal in the example depicted in FIG. 3) of the source, drain and/or gate fingers, or any combination thereof. Non-limiting examples of such FET parameter variations are described herein in greater detail.

Figure 4:
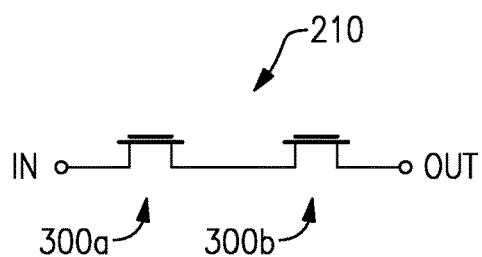
FIG. 4 shows a circuit representation of the example stack of FIG. 3.

FIG. 4 shows a circuit representation of the example stack 210 of FIG. 3. More particularly, the first and second FETs 300a, 300b can be connected in series so as to yield an input (IN) and an output (OUT) for the stack 210. Although described in such an input and output example, it will be understood that in some embodiments, each of the FETs 300a, 300b, and therefore the stack 210, can be operated in reverse where the source contacts act as drain contacts, and vice versa. Also, and as described herein, an FET stack can include more than two FETs.

Figure 5:
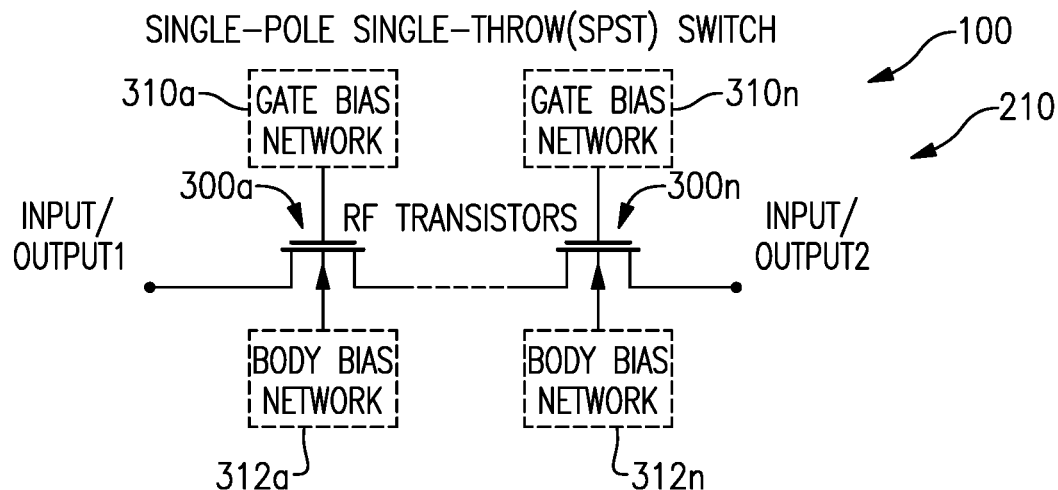
FIG. 5 shows an example of an RF switch having a stack of a plurality of FETs.

In some embodiments, an FET stack having two or more FETs can be implemented as an RF switch. FIG. 5 shows an example of an RF switch 100 having a stack 210 of a plurality of FETs (e.g., N of such FETs 300a to 300n). Such a switch can be configured as a single-pole-single-throw (SPST) switch. Although described in the context of such an example, it will be understood that one or more of stacks 210 can be implemented in other switch configurations.

In the example of FIG. 5, each of the FETs (300a to 300n) can be controlled by its respective gate bias network 310 and body bias network 312. In some implementations, such control operations can be performed in known manners.

Figure 6:
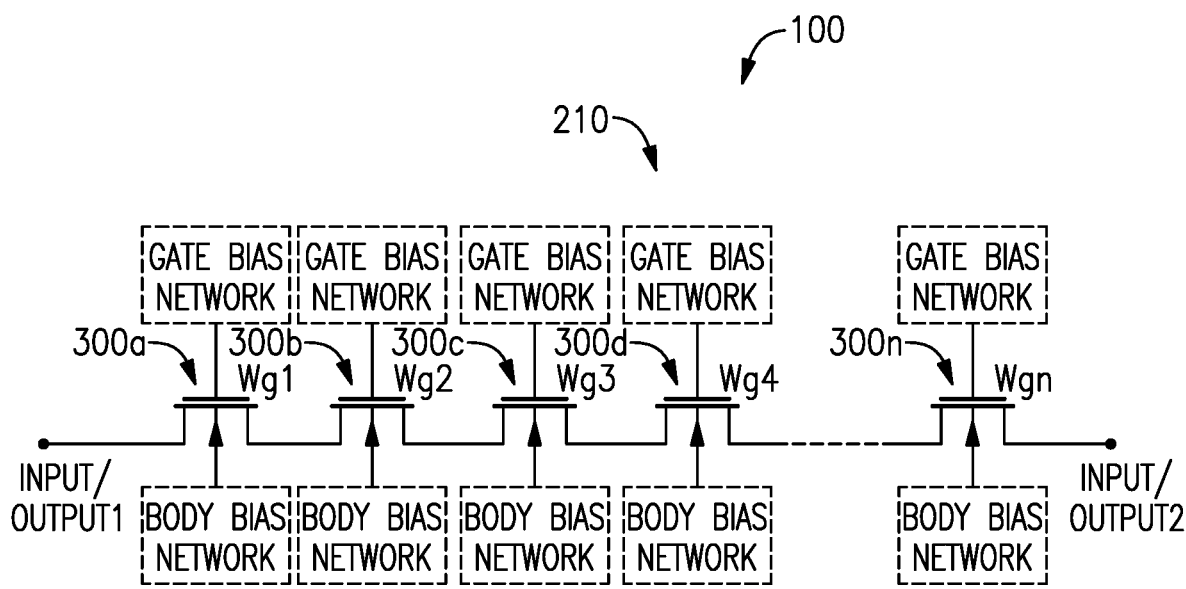
FIG. 6 shows an example RF switch where dimension variation of the FETs can be implemented as different gate widths.

As described herein, an RF switch such as the example of FIG. 5 can include variable-dimension FETs. FIG. 6 shows an example RF switch 100 where such dimension variation can be implemented as different gate widths. In the example, an FET stack 210 is shown to include FETs (300a-300n) with their respective gate widths (Wg1-Wgn). Some or all of such gate widths can be selected to be different so as to yield a desirable performance improvement for the RF switch 100. An example of such a performance improvement is described herein in greater detail.

Figure 7:
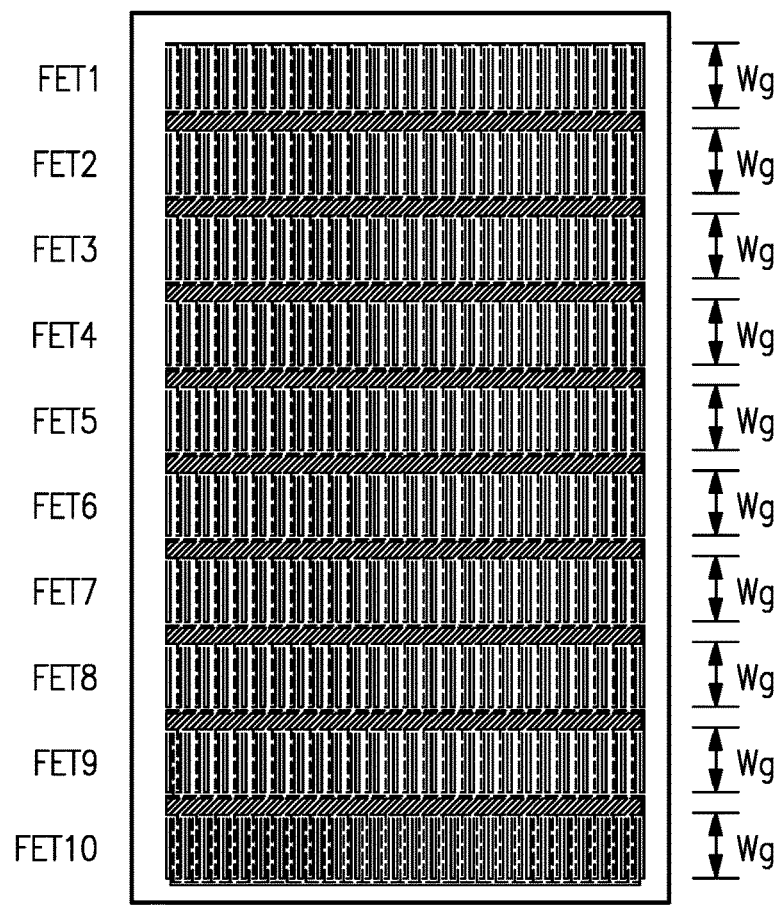
FIG. 7 shows an example stack of 10 FETs having a generally constant gate width of Wg.

FIG. 7 shows an example stack of 10 FETs having a generally constant gate width of Wg of approximately 10 μm. Each of the 10 FETs in FIG. 7 has 100 gate fingers. For clarity, electrical connections between the FETs are not shown.

Figure 8:
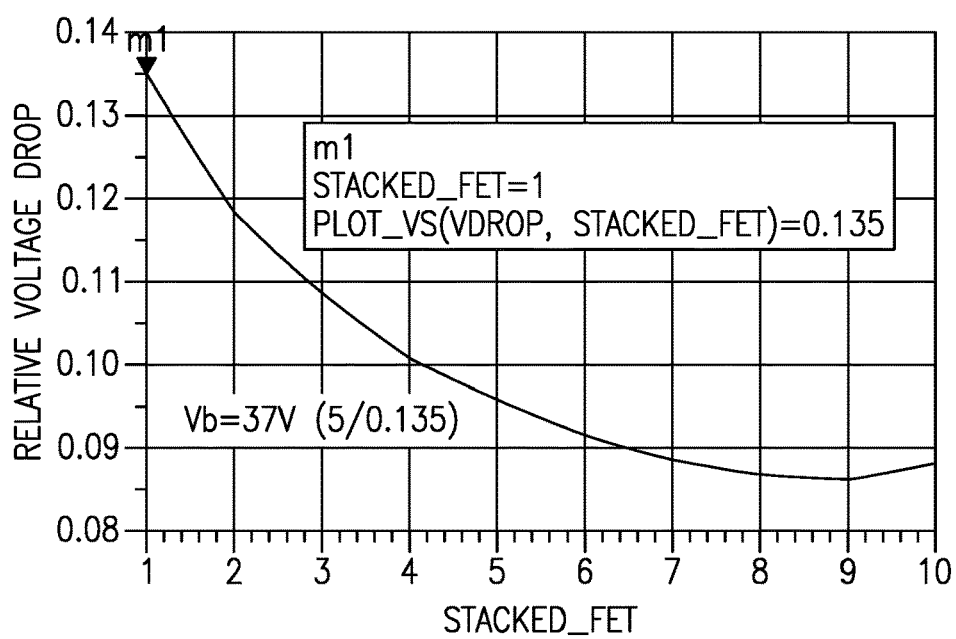
FIG. 8 shows an example of simulated data where relative voltage drop at each of the FETs of FIG. 7 is plotted against the FET number along the stack.

For such uniform-dimension FETs, FIG. 8 shows an example of simulated data where relative voltage drop at each of the FETs is plotted against the FET number along the stack. For example, there is a voltage drop of about 0.135 of the input voltage (5V in this example) across FET1, about 0.118 of the input voltage across FET2, and so on.

In FIG. 8, one can readily see that there is significant imbalance of voltage drop values along the stack. It should be understood that for other configurations and architectures having constant gate width, their voltage imbalances will also be close to, or be similar to, the example of FIG. 8. Such voltage imbalances may or may not closely follow the example of FIG. 8, but the general trend is typically similar, where the first FET (where the power is incident) is typically the limiting factor with the highest voltage drop. As described herein, such an uneven voltage distribution along the stack can result in degradation of switch performance with respect to, for example, harmonic peaking, compression point and/or intermodulation distortion (IMD). Also, at higher power levels, the first FET can go into breakdown before other FETs, thereby limiting the overall performance of the switch.

It is further noted that such an uneven voltage distribution can impact the breakdown voltage performance of the stack. For example, suppose that an input voltage of 5V is provided at an input of a stack having 10 FETs, and that voltage drop across each FET is substantially constant (e.g., 0.1 of the input voltage, or 0.5V, for the 10-FET example) so that there is no voltage imbalance within the stack. Also assume that each FET is capable of handling at least the example 5V without breaking down. Since each FET can handle 5V, and since there is no voltage imbalance, one can expect that the example stack as a whole can handle 10 times 5V, or 50V.

In a stack with an uneven voltage distribution, one can expect that an FET with the highest relative voltage drop will break down first when the input voltage is increased, thereby yielding a weak link within the stack. In the example of FIG. 8, such a weak link is the first FET which has the highest relative voltage drop value of approximately 0.135. Accordingly, a degraded breakdown voltage Vb for the example stack of FIGS. 7 and 8 can be estimated by scaling the input voltage (e.g., 5V) with the highest relative voltage drop value (0.135), as 5/0.135, or approximately 37V. Compared to the foregoing example of 50V for the constant-voltage drop (among the FETs), 37V is a significant reduction in voltage handling capability of the example stack of FIGS. 7 and 8.

Figure 9:
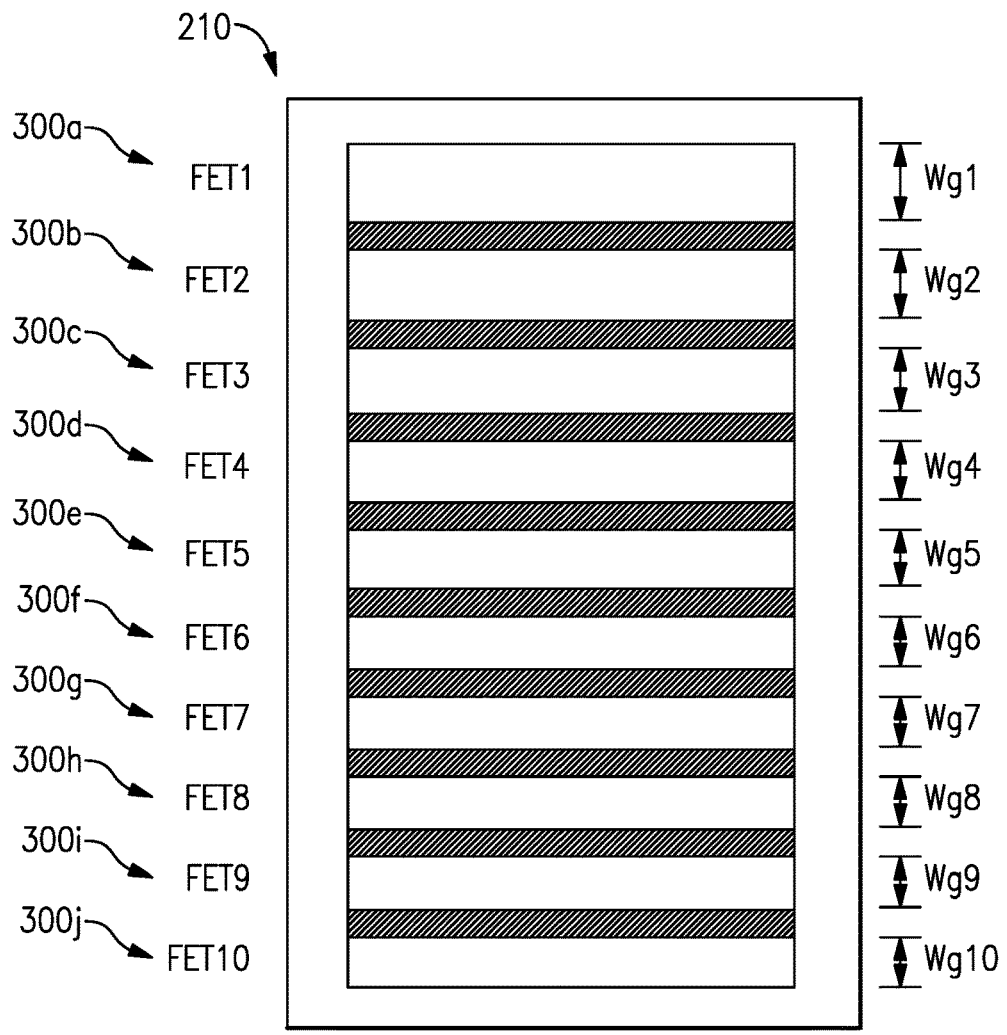
FIG. 9 shows an example stack of 10 FETs with varying gate widths Wg1-Wg10.

FIG. 9 shows an example stack 210 having 10 FETs (300a-300j) with respective gate widths Wg1-Wg10. Example values of the gate widths Wg1-Wg10 are listed in Table 1. Each of the 10 FETs (300a-300j) in FIG. 9 has 100 gate fingers. For clarity, electrical connections between the FETs are not shown.

TABLE 1

| FET # | Gate width | Gate width value (μm) |
|---|---|---|
| 1 | Wg1 | 13.6 |
| 2 | Wg2 | 11.9 |
| 3 | Wg3 | 10.8 |
| 4 | Wg4 | 10.0 |
| 5 | Wg5 | 9.5 |
| 6 | Wg6 | 8.9 |

TABLE 1-continued

| FET # | Gate width | Gate width value (μm) |
|---|---|---|
| 7 | Wg7 | 8.5 |
| 8 | Wg8 | 8.3 |
| 9 | Wg9 | 8.2 |
| 10 | Wg10 | 8.5 |

Figure 10:
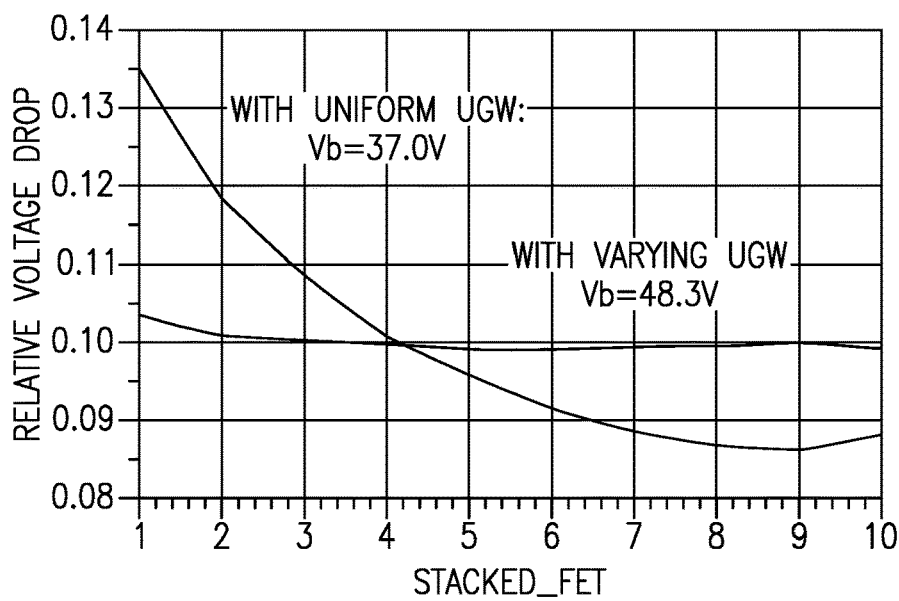
FIG. 10 shows an example of simulated data where relative voltage drop at each of the FETs of FIG. 9 is plotted against the FET number along the stack.

For such variable-dimension FETs, FIG. 10 shows an example of simulated data where relative voltage drop at each of the FETs is plotted against the FET number along the stack. For example, there is a voltage drop of about 0.103 of an input voltage (e.g., 5V) across FET1, about 0.101 of the input voltage across FET2, and so on. Compared to the example voltage distribution associated with FIGS. 7 and 8 (also shown in FIG. 10), voltage imbalance is reduced drastically so as to yield a generally even voltage distribution. Such an even voltage distribution along the stack can result in improvement of switch performance with respect to, for example, harmonic peaking, compression point and/ or intermodulation distortion (IMD).

It is further noted that in the even voltage distribution, the highest value is approximately 0.103 of the input voltage (across the first FET). Accordingly, and as described in reference to FIG. 8, a breakdown voltage of the example stack of FIG. 9 can be estimated by scaling the input voltage (e.g., 5V) with the weak link having the highest relative voltage drop (e.g., 0.103 for the first FET). One can see that such an estimate desirably yields a value of 5/0.103, or approximately 48V, which is very close to the estimate for an ideal configuration that does not have voltage imbalance. It should also be understood that with different periphery configurations, these voltage values may change; but the relatively evenly distributed voltage profile can still be obtained.

Figure 11:
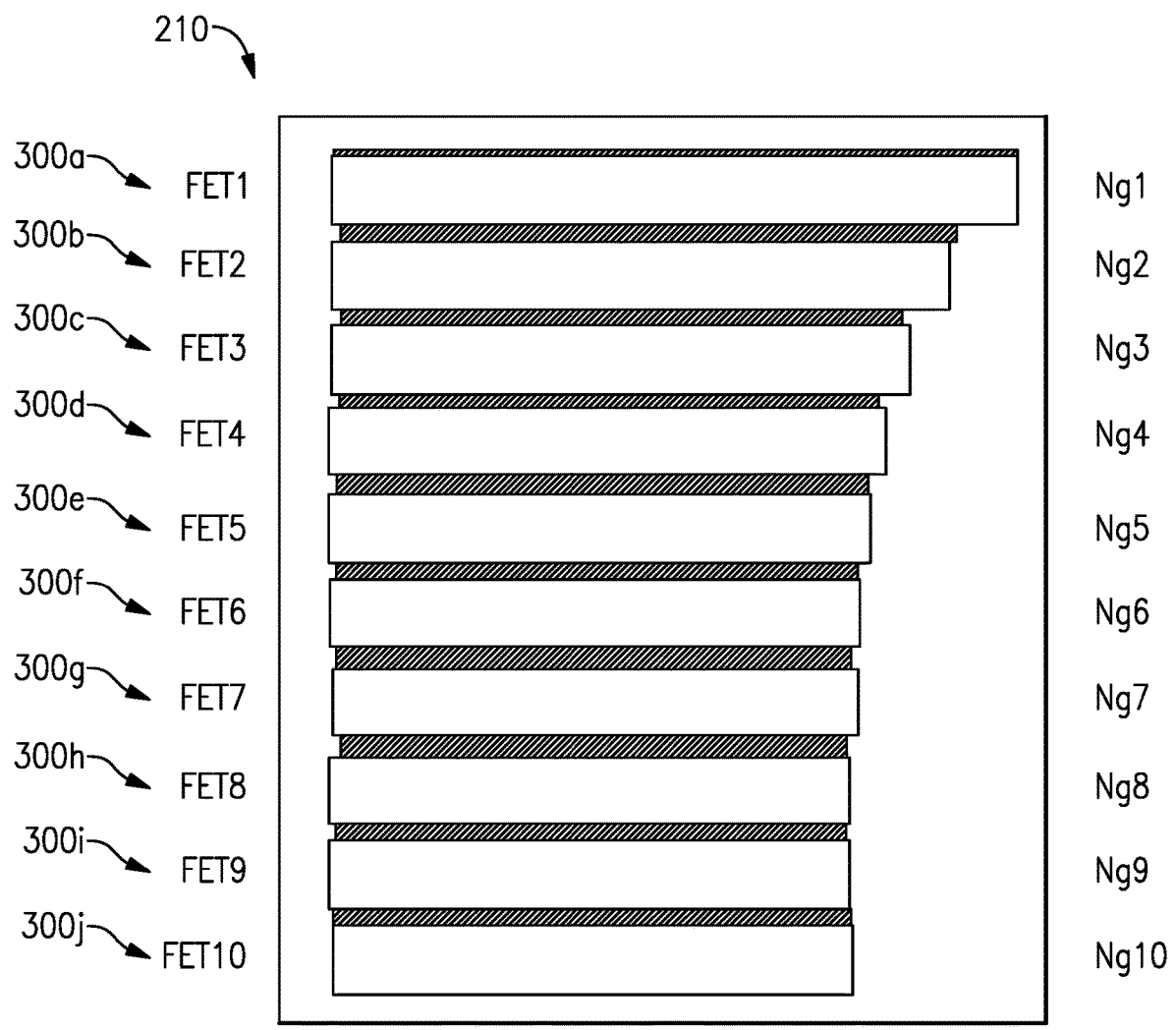
FIG. 11 shows another example FET stack where dimension variation can be implemented as different numbers of gate fingers.

FIG. 11 shows another example FET stack 210 where dimension variation can be implemented as different numbers of gate fingers. The example stack 210 includes 10 FETs (300a-300j) having a uniform gate width of approximately 10 μm. Different numbers of gate fingers in the FETs are shown as different lengths of the FETs (in FIG. 11, horizontal dimensions of the FETs).

In some embodiments, values of the numbers of gate fingers Ng1-Ng10 can be selected based on a voltage distribution profile that is being compensated. For example, suppose that a given stack has a voltage distribution profile similar to the example of FIG. 8. A revised stack such as the example of FIG. 11 can have values of a selected FET parameter (e.g., number of gate fingers) selected to compensate for the uneven distribution of the given stack (e.g., FIG. 8). In the example of FIG. 9, and referring to the example values of Table 1, one can see that varying of the gate width parameter can compensate for the uneven distribution of the example stack of FIG. 8.

For the examples of FIGS. 9 and 11, plots of gate widths and finger numbers, respectively, can have generally similar profiles as the voltage distribution (of FIG. 8) that is being compensated. More particularly, all of the three profiles have their highest values at FET1, decrease to the lowest values at FET9, and increase slightly at FET10. It will be understood that other FET-parameter profiles that may or may not be correlated to a profile being compensated are also possible. For example, there may be an FET parameter for which its distribution has an inverse shape as the example voltage distribution being compensated. Other FET parameters and/or distribution shapes are also possible.

In the foregoing examples, the profiles of FET-parameters (e.g., gate width or finger numbers) are described in the context of compensating an existing voltage distribution profile. Such an existing voltage distribution profile can result from measurement or modeling of, for example, an existing switch device, modeling of a new switch design, or some combination thereof. It will be understood that in some implementations, such an existing voltage distribution profile (however obtained) is not necessarily a requirement. For example, one or more features of the present disclosure can be implemented as an original design parameter, instead of being utilized as a compensation or correction technique.

In the context of the examples described herein in reference to FIGS. 9 and 11, the varying parameters (e.g., gate width and number of gate fingers) are described as having a gradient that changes generally monotonically for some or all of the FETs in one direction. It will be understood, however, that other grading configurations are also possible. For example, a grading scheme can include a maximum or a minimum at a switching element (e.g., at or close to the middle in a stack); and such a distribution may or may not be symmetric. In another example, there may be more than one local extrema in a grading scheme. In yet another example, there may be one or more step function distribution along a stack.

In some embodiments, a grading scheme can be implemented so as to yield a desired distribution of a stack parameter. For example, a grading scheme can be configured to yield a generally uniform distribution of voltage drops across the switching elements in a stack.

Figure 12A:
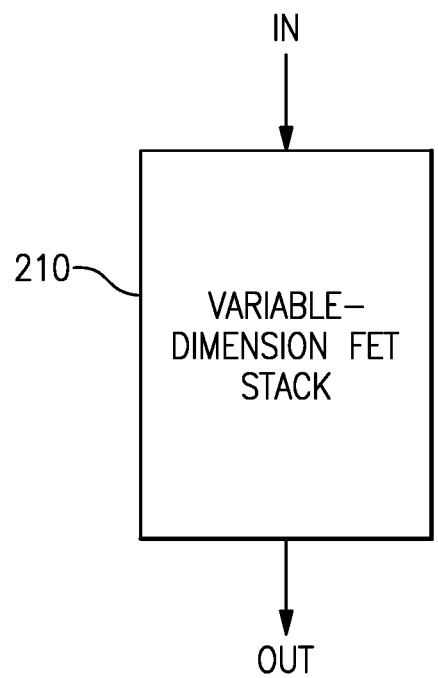
FIG. 12A shows that in some embodiments, a stack having one or more features as described herein can be configured so that an input signal is preferably received on one end of the stack.
Figure 12B:
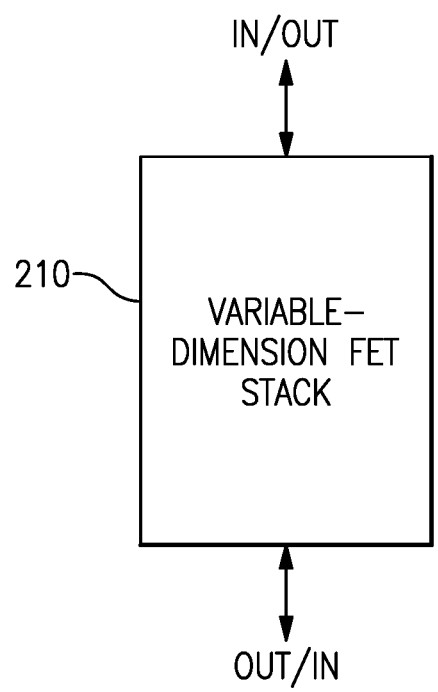
FIG. 12B shows that in some embodiments, a stack having one or more features as described herein can be configured so that an input signal can be received on either end of the stack.
Figure 13:
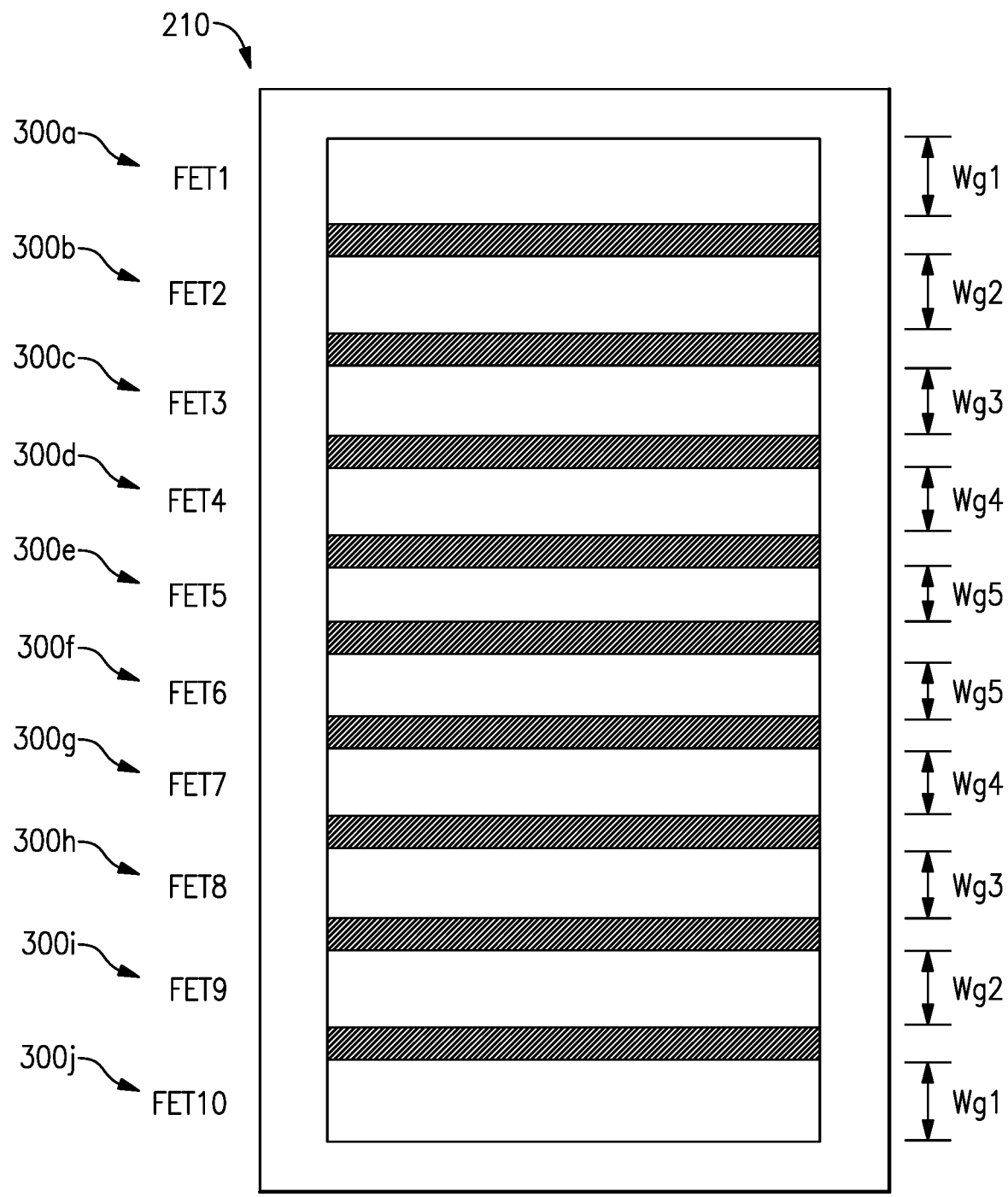
FIG. 13 shows an example stack having the functionality of FIG. 12B, implemented in the context of varying gate widths.
Figure 14:
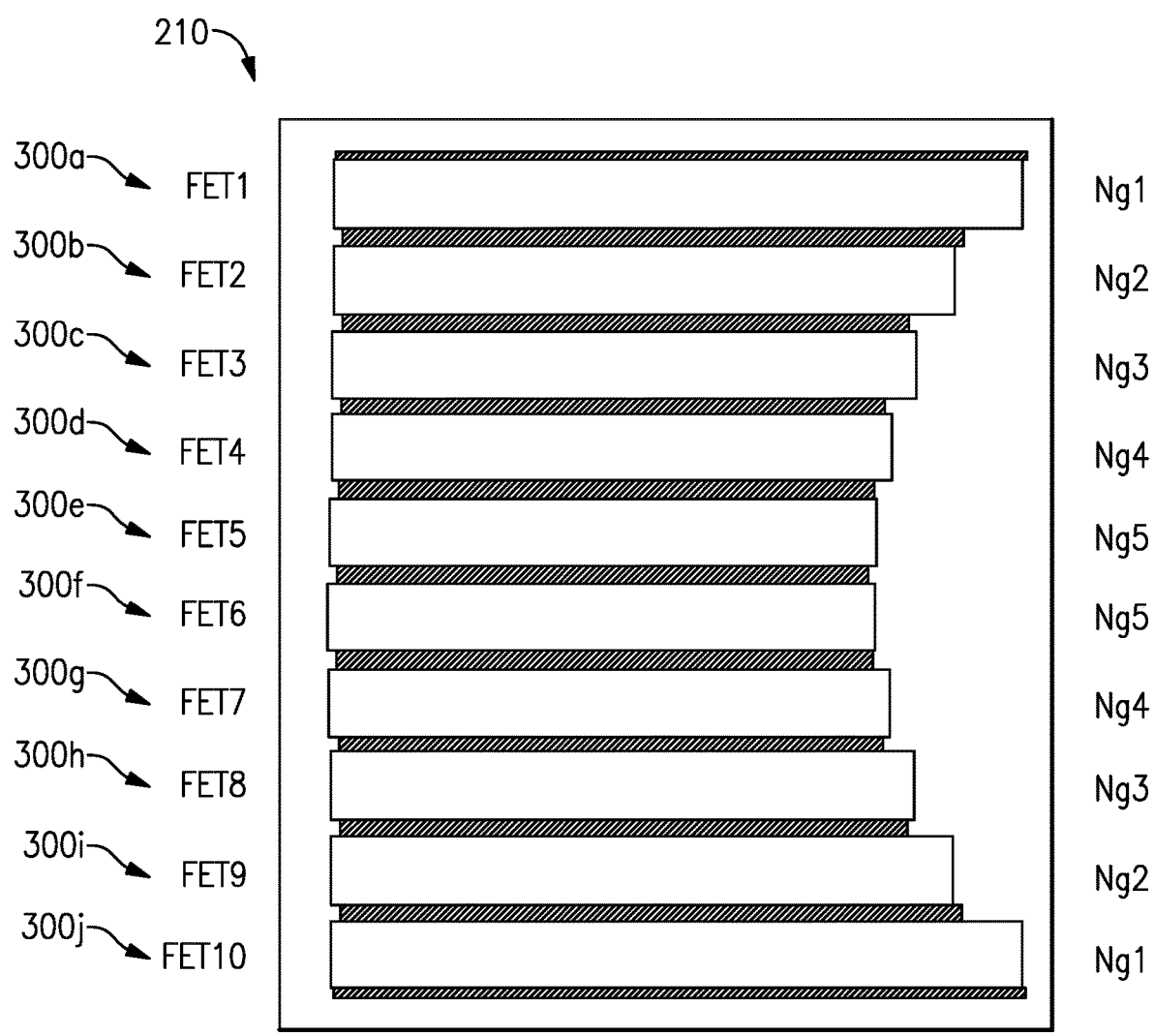
FIG. 14 shows an example stack having the functionality of FIG. 12B, implemented in the context of varying numbers of gate fingers.

FIGS. 12-14 show examples of how different grading schemes can be implemented to yield different directional functionalities of FET stacks. FIG. 12A shows that in some embodiments, a variable-dimension FET stack 210 can be configured to have an input (IN) preferably on one end, and therefore an output (OUT) on the other end. The FET stacks 210 described herein in reference to FIGS. 9-11 are examples where inputs are preferably provided on the side of their respective first FETs 300a (FET1), so as to accommodate the high voltage drop in the first FET.

FIG. 12B shows that in some embodiments, a variable-dimension FET stack 210 having one or more features as described herein can be configured to be bi-directional. Such a stack 210 can benefit from voltage compensation property as described herein when an input signal is provided to either end of the stack 210. FIG. 13 shows an example of such a bi-directional stack in the context of variable gate widths. FIG. 14 shows an example of such a bi-directional stack in the context of numbers of gate fingers. It will be understood that bi-directional functionality in variable-dimension FET stacks can also be implemented with other variations.

Referring to the example of FIG. 13, a variable-dimension FET stack 210 is shown to include 10 FETs 300a-300j (FET1-FET10). Each of the two end FETs (FET1, FET10) is shown to have a gate width of Wg1. Each of the second-to-end FETs (FET2, FET9) is shown have a gate width of Wg2. Similarly, the third (FET3, FET8), fourth (FET4, FET7) and fifth (FET5, FET6) FETs from their respective ends are shown to have gate widths of Wg3, Wg4 and Wg5, respectively. In the example of FIG. 13, the gate widths can be selected such that Wg1>Wg2>Wg3>Wg4>Wg5. Accordingly, the successive decrease in gate width of the FETs on each half of the FET stack advantageously allows a voltage drop profile on that half to be compensated as described herein.

In the example of FIG. 13, the 10 example FETs are depicted as having a symmetric gate width profile, where the highest gate width value is provided to the end FETs, and the lowest value is provided to the middle FET(s). However, it will be understood that bi-directional functionality can also be implemented in non-symmetric profiles.

Referring to the example of FIG. 14, a variable-dimension FET stack 210 is shown to include 10 FETs 300a-300j (FET1-FET10). Each of the two end FETs (FET1, FET10) is shown to have Ng1 gate fingers. Each of the second-to-end FETs (FET2, FET9) is shown have Ng2 gate fingers. Similarly, the third (FET3, FET8), fourth (FET4, FET7) and fifth (FET5, FET6) FETs from their respective ends are shown to have Ng3, Ng4 and Ng5 gate fingers, respectively. In the example of FIG. 14, the numbers of gate fingers can be selected such that Ng1>Ng2>Ng3>Ng4>Ng5. Accordingly, the successive decrease in the number of gate fingers of the FETs on each half of the FET stack advantageously allows a voltage drop profile on that half to be compensated as described herein.

The example of FIG. 14, the 10 example FETs are depicted as having a symmetric profile for the number of gate fingers, where the highest number of gate fingers is provided to the end FETs, and the lowest number is provided to the middle FET(s). However, it will be understood that bi-directional functionality can also be implemented in non-symmetric profiles.

As described herein, variations in switching elements are not necessarily limited to FETs. For example, variations in a stack of diodes can be implemented to achieve desired performance results. In the context of diodes, such variations can be implemented with respect to, for example, junction area and/or multiplicity of diodes in parallel for the switching elements.

In another example, variations in a stack of MEMS devices (e.g., MEMS-capacitors or MEMS-switches) can be implemented to achieve desired performance results. In the context of such devices, variations can be implemented with respect to, for example, contact area and/or multiplicity of devices in parallel for the switching elements.

Figure 15:
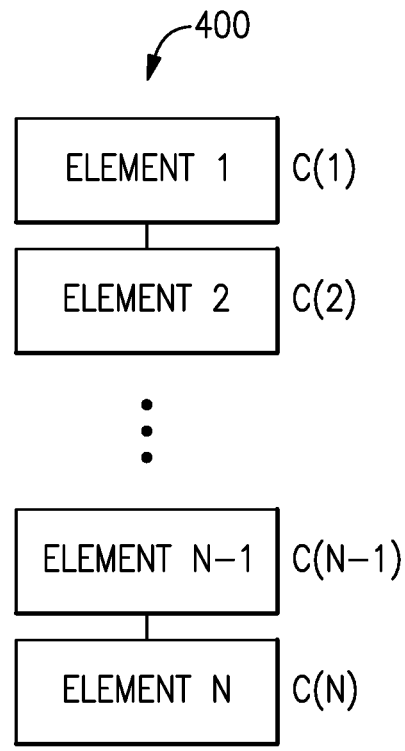
FIG. 15 shows that in some embodiments, a stack having one or more features as described herein can be implemented as N elements electrically connected in series, with an i-th element having a capacitance C(i).

FIG. 15 shows that in some embodiments, a stack 400 having one or more features as described herein can be implemented as N elements electrically connected in series. For the purpose of description, N can be an integer greater than 1. In the example stack, a given element (i-th element) is shown to have a capacitance C(i). Accordingly, Element 1 has a capacitance of C(1), Element 2 has a capacitance of C(2), etc.

Figure 16:
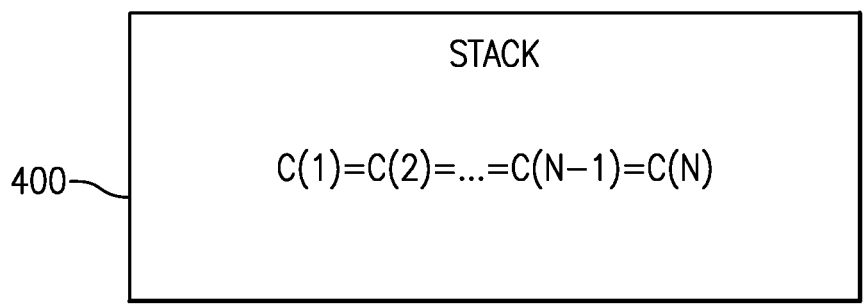
FIG. 16 shows that in some embodiments, the stack of FIG. 12 can be configured to yield a desirable capacitance profile for the elements, such as, for example, the capacitance values of the elements being approximately uniform.

FIG. 16 shows that in some embodiments, a stack 400 having the example elements of FIG. 15 can be configured so as to yield a desirable profile of capacitance values for the elements. For example, the capacitance values of the elements can be approximately the same, such that $C(1) = C(2) \approx \ldots \approx C(N-1) \approx C(N)$.

In the foregoing example of characterizing and adjusting in the context of capacitance, the gate-parameter adjustment examples of FIGS. 9 and 11, each FET can be characterized in terms of capacitance associated with lateral dimensions of the gate. If such a capacitor-configuration is approximated as a parallel-plate capacitor, capacitance can be proportional to the lateral area of the gate, and the corresponding voltage can be inversely proportional to the lateral area of the gate. Thus, a decrease in the gate width (FIG. 9) results in a decrease in the lateral area, and therefore an increase in the voltage of the capacitance representation. Similarly, a decrease in the gate-finger count (FIG. 11) results a decrease in the lateral area, and therefore an increase in the voltage of the capacitance representation. Accordingly, a given voltage distribution (e.g., FIG. 8) can be compensated by adjusting the capacitances associated with the elements (e.g., FETs).

FIGS. 17-22 show non-limiting examples of switching applications where one or more features of the present disclosure can be implemented. FIGS. 23 and 24 show examples where one or more features of the present disclosure can be implemented in, for example, SOI devices. FIG. 25-28 show examples of how one or more features of the present disclosure can be implemented in different products.

Figure 17:
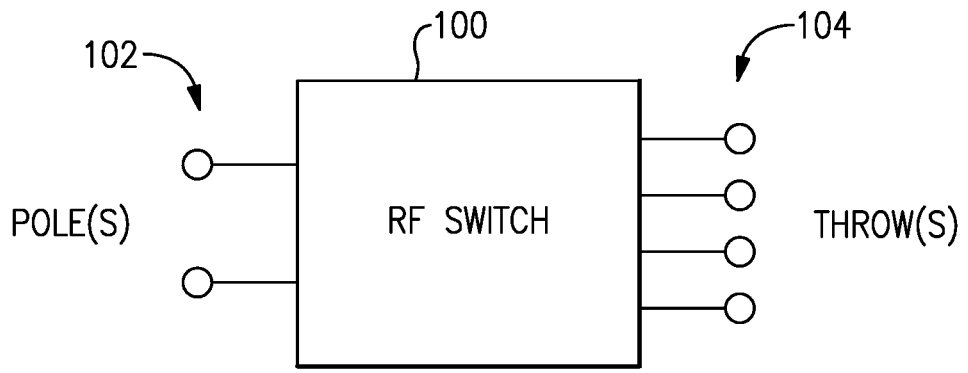
FIG. 17 depicts an RF switch configured to switch one or more signals between one or more poles and one or more throws.

Example Components of a Switching Device:

FIG. 17 schematically shows a radio-frequency (RF) switch 100 configured to switch one or more signals between one or more poles 102 and one or more throws 104. In some embodiments, such a switch can be based on one or more field-effect transistors (FETs) such as silicon-on-insulator (SOI) FETs. When a particular pole is connected to a particular throw, such a path is commonly referred to as being closed or in an ON state. When a given path between a pole and a throw is not connected, such a path is commonly referred to as being open or in an OFF state.

Figure 18:
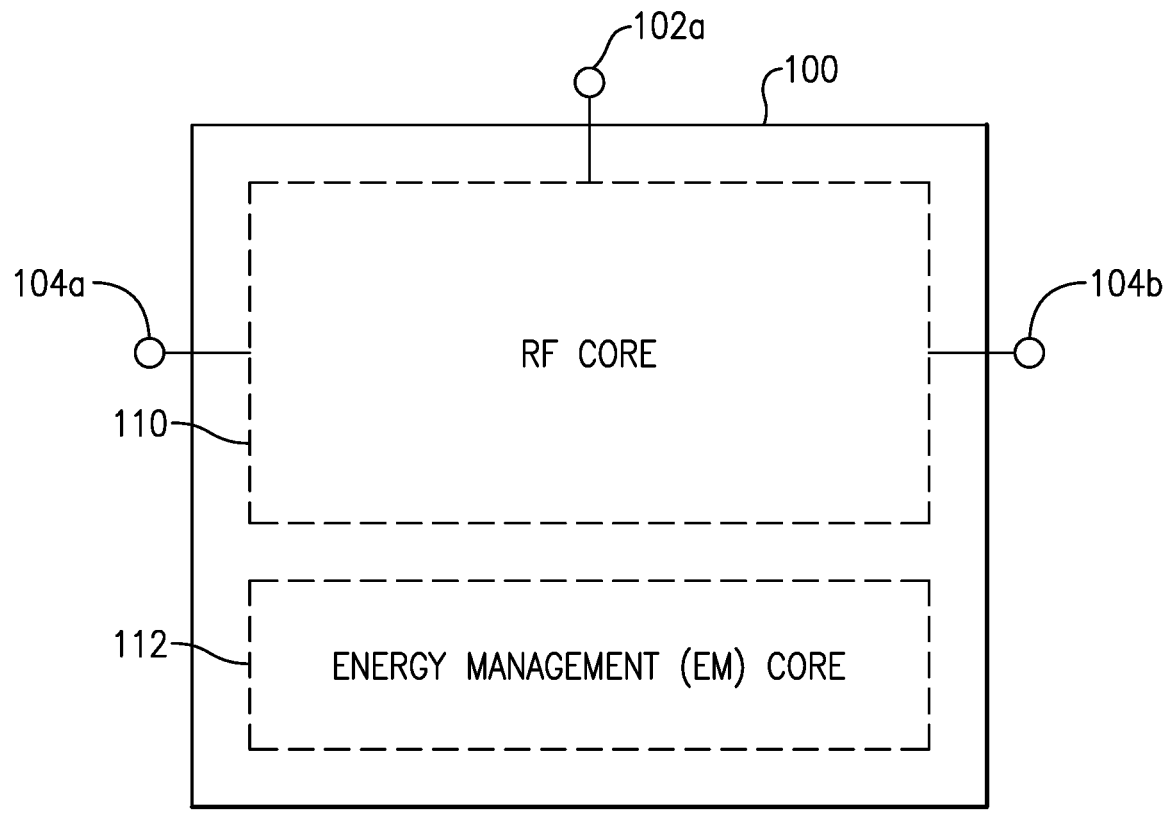
FIG. 18 shows that in some embodiments, the RF switch of FIG. 14 can include an RF core and an energy management (EM) core.

FIG. 18 shows that in some implementations, the RF switch 100 of FIG. 17 can include an RF core 110 and an energy management (EM) core 112. The RF core 110 can be configured to route RF signals between the first and second ports. In the example single-pole-double-throw (SPDT) configuration shown in FIG. 18, such first and second ports can include a pole 102a and a first throw 104a, or the pole 102a and a second throw 104b.

In some embodiments, EM core 112 can be configured to supply, for example, voltage control signals to the RF core. The EM core 112 can be further configured to provide the RF switch 100 with logic decoding and/or power supply conditioning capabilities.

In some embodiments, the RF core 110 can include one or more poles and one or more throws to enable passage of RF signals between one or more inputs and one or more outputs of the switch 100. For example, the RF core 110 can include a single-pole double-throw (SPDT or SP2T) configuration as shown in FIG. 18.

Figure 19:
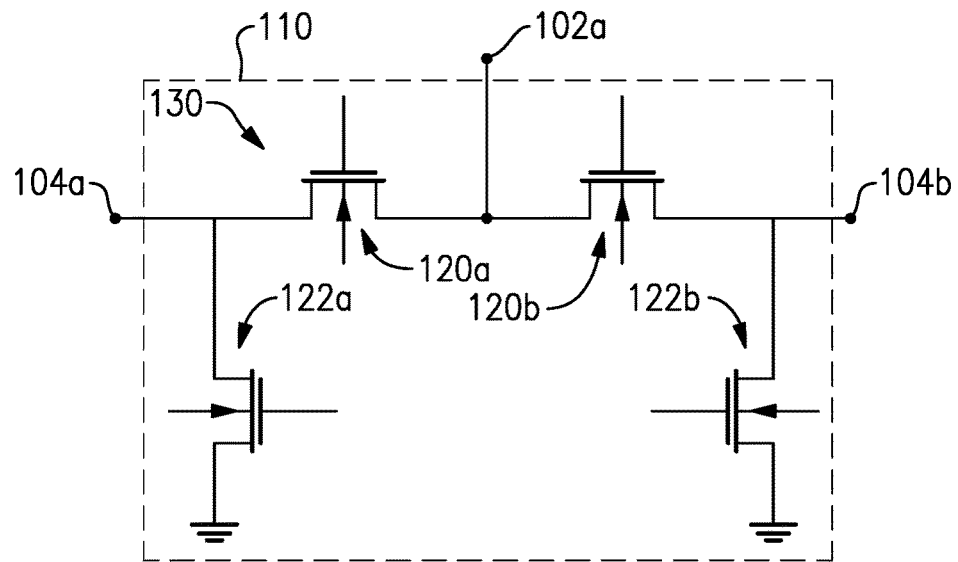
FIG. 19 shows a more detailed example configuration of the RF core of FIG. 15, implemented in an example SPDT (single-pole double-throw) configuration.

In the example SPDT context, FIG. 19 shows a more detailed example configuration of an RF core 110. The RF core 110 is shown to include a single pole 102a coupled to first and second throw nodes 104a, 104b via first and second transistors (e.g., FETs) 120a, 120b. The first throw node 104a is shown to be coupled to an RF ground via an FET 122a to provide shunting capability for the node 104a. Similarly, the second throw node 104b is shown to be coupled to the RF ground via an FET 122b to provide shunting capability for the node 104b.

In an example operation, when the RF core 110 is in a state where an RF signal is being passed between the pole 102a and the first throw 104a, the FET 120a between the pole 102a and the first throw node 104a can be in an ON state, and the FET 120b between the pole 102a and the second throw node 104b can be in an OFF state. For the shunt FETs 122a, 122b, the shunt FET 122a can be in an OFF state so that the RF signal is not shunted to ground as it travels from the pole 102a to the first throw node 104a. The shunt FET 122b associated with the second throw node 104b can be in an ON state so that any RF signals or noise arriving at the RF core 110 through the second throw node 104b is shunted to the ground so as to reduce undesirable interference effects to the pole-to-first-throw operation.

Although the foregoing example is described in the context of a single-pole-double-throw configuration, it will be understood that the RF core can be configured with other numbers of poles and throws. For example, there may be more than one poles, and the number of throws can be less than or greater than the example number of two.

In the example of FIG. 19, the transistors between the pole 102a and the two throw nodes 104a, 104b are depicted as single transistors. In some implementations, such switching functionalities between the pole(s) and the throw(s) can be provided by switch arm segments, where each switch arm segment includes a plurality of transistors such as FETs.

Figure 20:
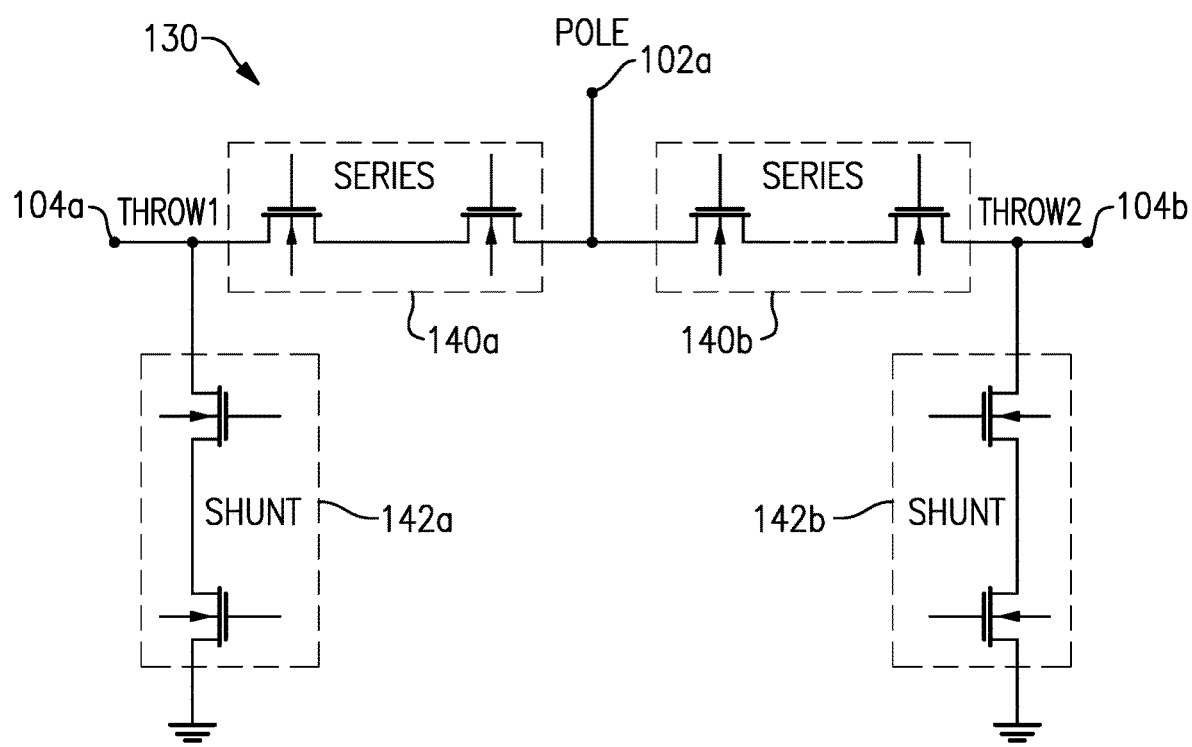
FIG. 20 shows an example where the SPDT configuration of FIG. 19 is implemented with a stack of FETs for each of a series arm and a shunt arm associated with each of the two throws.

An example RF core configuration 130 of an RF core having such switch arm segments is shown in FIG. 20. In the example, the pole 102a and the first throw node 104a are shown to be coupled via a first switch arm segment 140a. Similarly, the pole 102a and the second throw node 104b are shown to be coupled via a second switch arm segment 140b. The first throw node 104a is shown to be capable of being shunted to an RF ground via a first shunt arm segment 142a. Similarly, the second throw node 104b is shown to be capable of being shunted to the RF ground via a second shunt arm segment 142b.

In an example operation, when the RF core 130 is in a state where an RF signal is being passed between the pole 102a and the first throw node 104a, all of the FETs in the first switch arm segment 140a can be in an ON state, and all of the FETs in the second switch arm segment 104b can be in an OFF state. The first shunt arm 142a for the first throw node 104a can have all of its FETs in an OFF state so that the RF signal is not shunted to ground as it travels from the pole 102a to the first throw node 104a. All of the FETs in the second shunt arm 142b associated with the second throw node 104b can be in an ON state so that any RF signals or noise arriving at the RF core 130 through the second throw node 104b is shunted to the ground so as to reduce undesirable interference effects to the pole-to-first-throw operation.

Again, although described in the context of an SP2T configuration, it will be understood that RF cores having other numbers of poles and throws can also be implemented.

In some implementations, a switch arm segment (e.g., 140a, 140b, 142a, 142b) can include one or more semiconductor transistors such as FETs. In some embodiments, an FET may be capable of being in a first state or a second state and can include a gate, a drain, a source, and a body (sometimes also referred to as a substrate). In some embodiments, an FET can include a metal-oxide-semiconductor field effect transistor (MOSFET). In some embodiments, one or more FETs can be connected in series forming a first end and a second end such that an RF signal can be routed between the first end and the second end when the FETs are in a first state (e.g., ON state).

Figure 21:
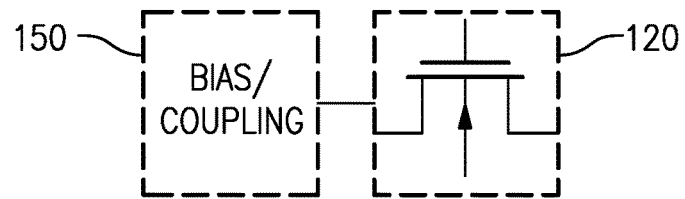
FIG. 21 shows that FETs having one or more features as described herein can be controlled by a circuit configured to provide bias and/or coupling functionality.

At least some of the present disclosure relates to how an FET or a group of FETs can be controlled to provide switching functionalities in desirable manners. FIG. 21 schematically shows that in some implementations, such controlling of an FET 120 can be facilitated by a circuit 150 configured to bias and/or couple one or more portions of the FET 120. In some embodiments, such a circuit 150 can include one or more circuits configured to bias and/or couple a gate of the FET 120, bias and/or couple a body of the FET 120, and/or couple a source/drain of the FET 120.

Figure 22:
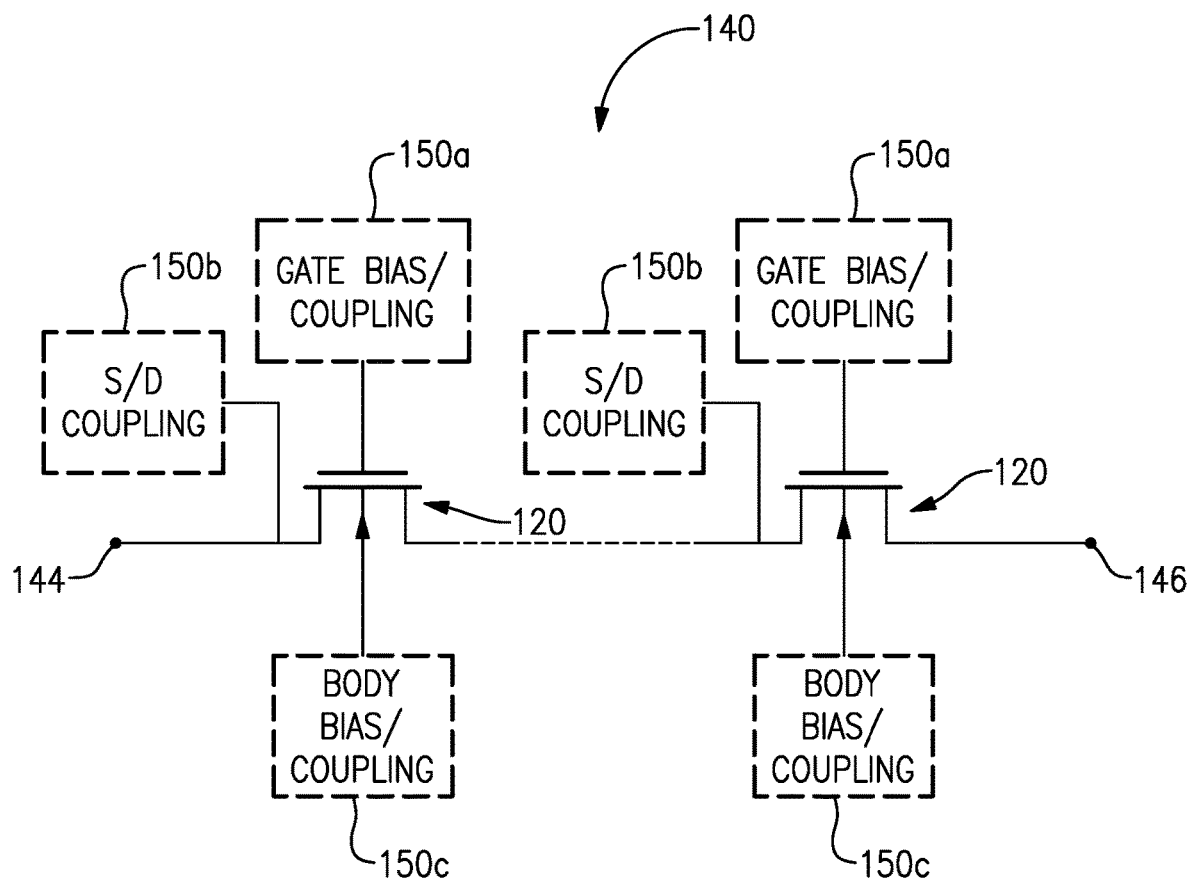
FIG. 22 shows examples of how biasing and/or coupling of different parts of one or more FETs can be implemented.

Schematic examples of how such biasing and/or coupling of different parts of one or more FETs are described in reference to FIG. 22. In FIG. 22, a switch arm segment 140 (that can be, for example, one of the example switch arm segments 140a, 140b, 142a, 142b of the example of FIG. 20) between nodes 144, 146 is shown to include a plurality of FETs 120. Operations of such FETs can be controlled and/or facilitated by a gate bias/coupling circuit 150a, and a body bias/coupling circuit 150c, and/or a source/drain coupling circuit 150b.

Gate Bias/Coupling Circuit

In the example shown in FIG. 22, the gate of each of the FETs 120 can be connected to the gate bias/coupling circuit 150a to receive a gate bias signal and/or couple the gate to another part of the FET 120 or the switch arm 140. In some implementations, designs or features of the gate bias/coupling circuit 150a can improve performance of the switch arm 140. Such improvements in performance can include, but are not limited to, device insertion loss, isolation performance, power handling capability and/or switching device linearity.

Body Bias/Coupling Circuit

As shown in FIG. 22, the body of each FET 120 can be connected to the body bias/coupling circuit 150c to receive a body bias signal and/or couple the body to another part of the FET 120 or the switch arm 140. In some implementations, designs or features of the body bias/coupling circuit 150c can improve performance of the switch arm 140. Such improvements in performance can include, but are not limited to, device insertion loss, isolation performance, power handling capability and/or switching device linearity.

Source/Drain Coupling Circuit

As shown in FIG. 22, the source/drain of each FET 120 can be connected to the coupling circuit 150b to couple the source/drain to another part of the FET 120 or the switch arm 140. In some implementations, designs or features of the coupling circuit 150b can improve performance of the switch arm 140. Such improvements in performance can include, but are not limited to, device insertion loss, isolation performance, power handling capability and/or switching device linearity.

Examples of Switching Performance Parameters:

Insertion Loss

A switching device performance parameter can include a measure of insertion loss. A switching device insertion loss can be a measure of the attenuation of an RF signal that is routed through the RF switching device. For example, the magnitude of an RF signal at an output port of a switching device can be less than the magnitude of the RF signal at an input port of the switching device. In some embodiments, a switching device can include device components that introduce parasitic capacitance, inductance, resistance, or conductance into the device, contributing to increased switching device insertion loss. In some embodiments, a switching device insertion loss can be measured as a ratio of the power or voltage of an RF signal at an input port to the power or voltage of the RF signal at an output port of the switching device. Decreased switching device insertion loss can be desirable to enable improved RF signal transmission.

Isolation

A switching device performance parameter can also include a measure of isolation. Switching device isolation can be a measure of the RF isolation between an input port and an output port an RF switching device. In some embodiments, it can be a measure of the RF isolation of a switching device while the switching device is in a state where an input port and an output port are electrically isolated, for example while the switching device is in an OFF state. Increased switching device isolation can improve RF signal integrity. In certain embodiments, an increase in isolation can improve wireless communication device performance.

Intermodulation Distortion

A switching device performance parameter can further include a measure of intermodulation distortion (IMD) performance. Intermodulation distortion (IMD) can be a measure of non-linearity in an RF switching device.

IMD can result from two or more signals mixing together and yielding frequencies that are not harmonic frequencies. For example, suppose that two signals have fundamental frequencies $f_1$ and $f_2$ ($f_2 > f_1$) that are relatively close to each other in frequency space. Mixing of such signals can result in peaks in frequency spectrum at frequencies corresponding to different products of fundamental and harmonic frequencies of the two signals. For example, a second-order intermodulation distortion (also referred to as IMD2) is typically considered to include frequencies $f_1 + f_2$, $f_2 - f_1$, $2f_1$, and $2f_2$. A third-order IMD (also referred to as IMD3) is typically considered to include $2f_1 - f_2$, $f_1 + 2f_2$, $f_1 - 2f_2$. Higher order products can be formed in similar manners.

In general, as the IMD order number increases, power levels decrease. Accordingly, second and third orders can be undesirable effects that are of particular interest. Higher orders such as fourth and fifth orders can also be of interest in some situations.

In some RF applications, it can be desirable to reduce susceptibility to interference within an RF system. Non linearity in RF systems can result in introduction of spurious signals into the system. Spurious signals in the RF system can result in interference within the system and degrade the information transmitted by RF signals. An RF system having increased non-linearity can demonstrate increased susceptibility to interference. Non-linearity in system components, for example switching devices, can contribute to the introduction of spurious signals into the RF system, thereby contributing to degradation of overall RF system linearity and IMD performance.

In some embodiments, RF switching devices can be implemented as part of an RF system including a wireless communication system. IMD performance of the system can be improved by increasing linearity of system components, such as linearity of an RF switching device. In some embodiments, a wireless communication system can operate in a multi-band and/or multi-mode environment. Improvement in intermodulation distortion (IMD) performance can be desirable in wireless communication systems operating in a multi-band and/or multi-mode environment. In some embodiments, improvement of a switching device IMD performance can improve the IMD performance of a wireless communication system operating in a multi-mode and/or multi-band environment.

Improved switching device IMD performance can be desirable for wireless communication devices operating in various wireless communication standards, for example for wireless communication devices operating in the LTE communication standard. In some RF applications, it can be desirable to improve linearity of switching devices operating in wireless communication devices that enable simultaneous transmission of data and voice communication. For example, improved IMD performance in switching devices can be desirable for wireless communication devices operating in the LTE communication standard and performing simultaneous transmission of voice and data communication (e.g., SVLTE).

High Power Handling Capability

In some RF applications, it can be desirable for RF switching devices to operate under high power while reducing degradation of other device performance parameters. In some embodiments, it can be desirable for RF switching devices to operate under high power with improved intermodulation distortion, insertion loss, and/or isolation performance.

In some embodiments, an increased number of transistors can be implemented in a switch arm segment of a switching device to enable improved power handling capability of the switching device. For example, a switch arm segment can include an increased number of FETs connected in series, an increased FET stack height, to enable improved device performance under high power. However, in some embodiments, increased FET stack height can degrade the switching device insertion loss performance.

Examples of FET Structures and Fabrication Process Technologies:

A switching device can be implemented on-die, off-die, or some combination thereon. A switching device can also be fabricated using various technologies. In some embodiments, RF switching devices can be fabricated with silicon or silicon-on-insulator (SOI) technology.

As described herein, an RF switching device can be implemented using silicon-on-insulator (SOI) technology. In some embodiments, SOI technology can include a semiconductor substrate having an embedded layer of electrically insulating material, such as a buried oxide layer beneath a silicon device layer. For example, an SOI substrate can include an oxide layer embedded below a silicon layer. Other insulating materials known in the art can also be used.

Implementation of RF applications, such as an RF switching device, using SOI technology can improve switching device performance. In some embodiments, SOI technology can enable reduced power consumption. Reduced power consumption can be desirable in RF applications, including those associated with wireless communication devices. SOI technology can enable reduced power consumption of device circuitry due to decreased parasitic capacitance of transistors and interconnect metallization to a silicon substrate. Presence of a buried oxide layer can also reduce junction capacitance or use of high resistivity substrate, enabling reduced substrate related RF losses. Electrically isolated SOI transistors can facilitate stacking, contributing to decreased chip size.

Figure 23A:
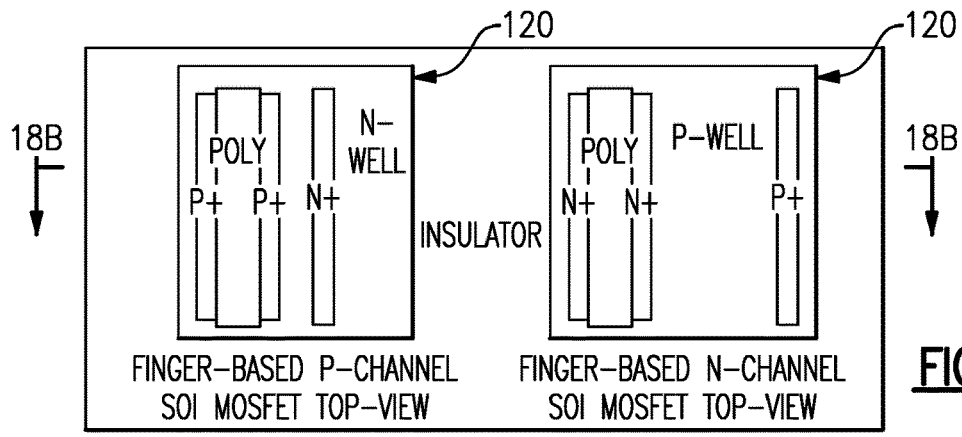
FIGS. 23A and 23B show plan and side sectional views of an example finger-based FET device implemented on silicon-on-insulator (SOI).
Figure 23B:
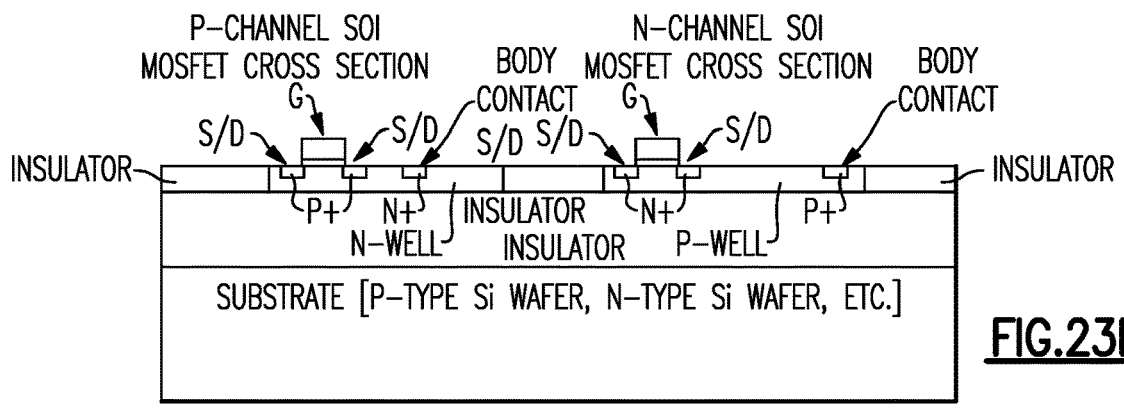

In some SOI FET configurations, each transistor can be configured as a finger-based device where the source and drain are rectangular shaped (in a plan view) and a gate structure extends between the source and drain like a rectangular shaped finger. FIGS. 23A and 23B show plan and side sectional views of an example finger-based FET device implemented on SOI. As shown, FET devices described herein can include a p-type FET or an n-type FET. Thus, although some FET devices are described herein as p-type devices, it will be understood that various concepts associated with such p-type devices can also apply to n-type devices.

As shown in FIGS. 23A and 23B, a pMOSFET can include an insulator layer formed on a semiconductor substrate. The insulator layer can be formed from materials such as silicon dioxide or sapphire. An n-well is shown to be formed in the insulator such that the exposed surface generally defines a rectangular region. Source (S) and drain (D) are shown to be p-doped regions whose exposed surfaces generally define rectangles. As shown, S/D regions can be configured so that source and drain functionalities are reversed.

FIGS. 23A and 23B further show that a gate (G) can be formed on the n-well so as to be positioned between the source and the drain. The example gate is depicted as having a rectangular shape that extends along with the source and the drain. Also shown is an n-type body contact. Formations of the rectangular shaped well, source and drain regions, and the body contact can be achieved by a number of known techniques.

Figure 24A:
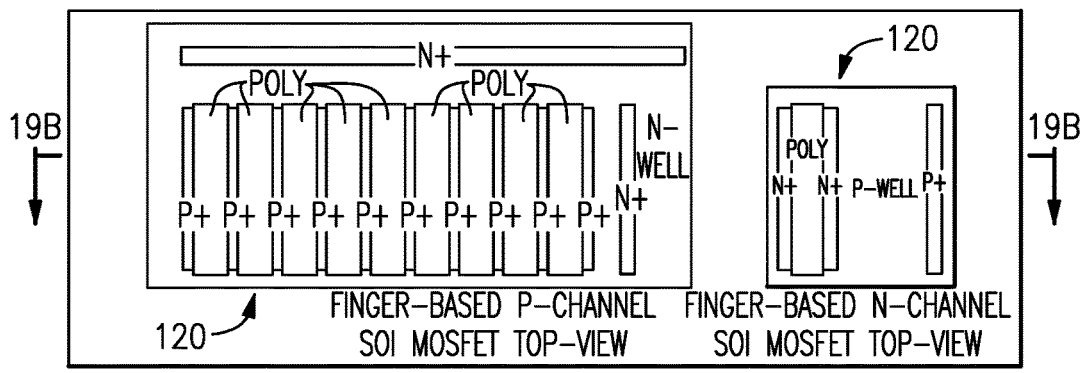
FIGS. 24A and 24B show plan and side sectional views of an example multiple-finger FET device implemented on SOI.
Figure 24B:
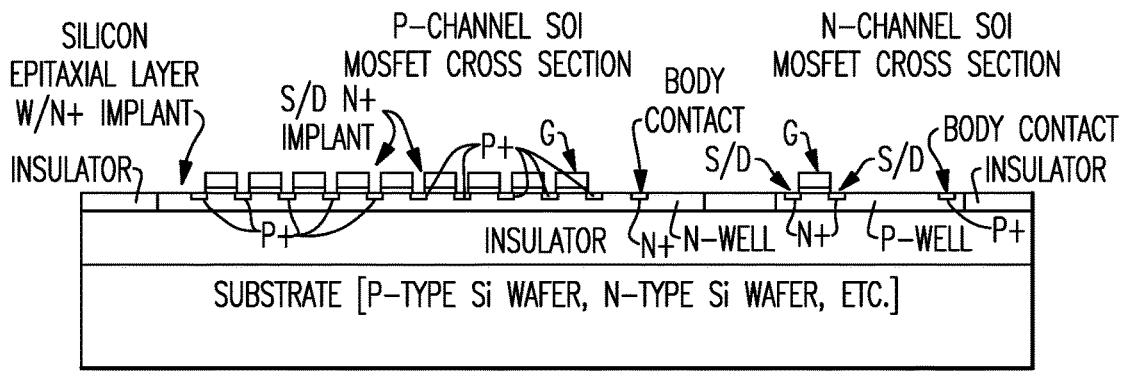

FIGS. 24A and 24B show plan and side sectional views of an example of a multiple-finger FET device implemented on SOI. Formations of rectangular shaped n-well, rectangular shaped p-doped regions, rectangular shaped gates, and n-type body contact can be achieved in manners similar to those described in reference to FIGS. 23A and 23B.

The example multiple-finger FET device of FIGS. 24A and 24B can be configured so that the source regions are electrically connected together to a source node, and the drain regions are connected together to a drain node. The gates can also be connected together to a gate node. In such an example configuration, a common gate bias signal can be provided through the gate node to control flow of current between the source node and the drain node.

In some implementations, a plurality of the foregoing multi-finger FET devices can be connected in series as a switch to allow handling of high power RF signals. Each FET device can divide the overall voltage drop associated with power dissipation at the connected FETs. A number of such multi-finger FET devices can be selected based on, for example, power handling requirement of the switch.

Examples of Implementations in Products:

Various examples of FET-based switch circuits described herein can be implemented in a number of different ways and at different product levels. Some of such product implementations are described by way of examples.

Semiconductor Die Implementation

Figure 25A:
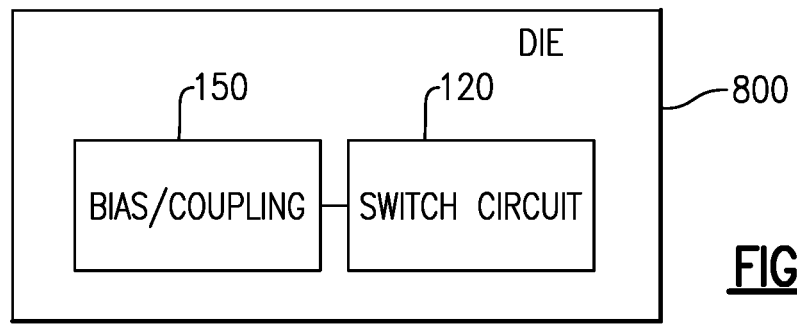
FIGS. 25A-25D show non-limiting examples of how one or more features of the present disclosure can be implemented on one or more semiconductor die.
Figure 25B:
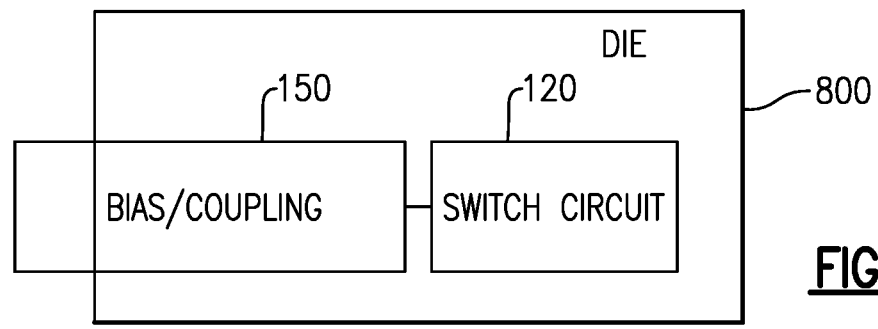

FIGS. 25A-25D schematically show non-limiting examples of such implementations on one or more semiconductor die. FIG. 25A shows that in some embodiments, a switch circuit 120 and a bias/coupling circuit 150 having one or more features as described herein can be implemented on a die 800. FIG. 25B shows that in some embodiments, at least some of the bias/coupling circuit 150 can be implemented outside of the die 800 of FIG. 25A.

Figure 25C:
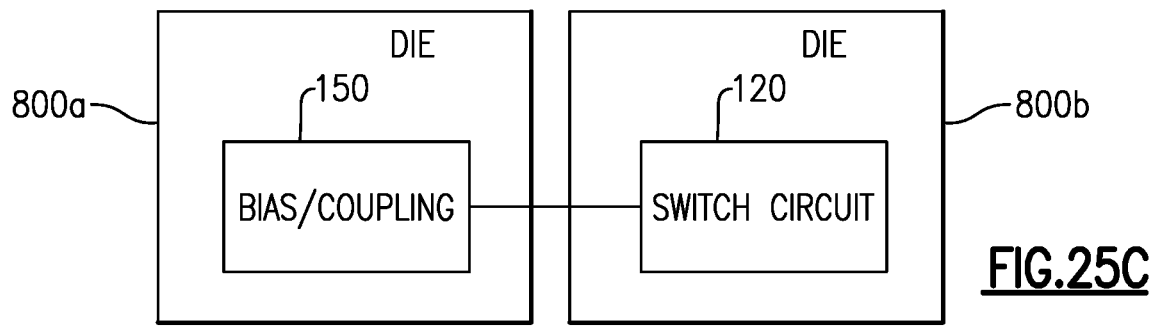
Figure 25D:
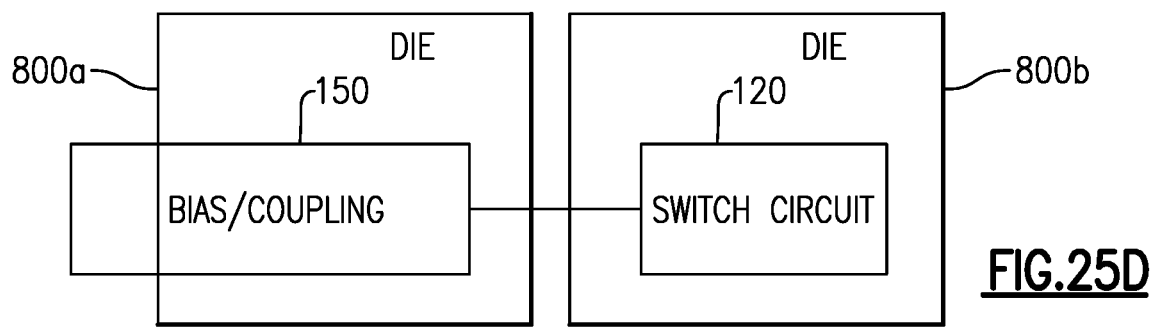

FIG. 25C shows that in some embodiments, a switch circuit 120 having one or more features as described herein can be implemented on a first die 800*a*, and a bias/coupling circuit 150 having one or more features as described herein can be implemented on a second die 800*b*. FIG. 25D shows that in some embodiments, at least some of the bias/coupling circuit 150 can be implemented outside of the first die 800*a* of FIG. 25C.

Packaged Module Implementation

Figure 26A:
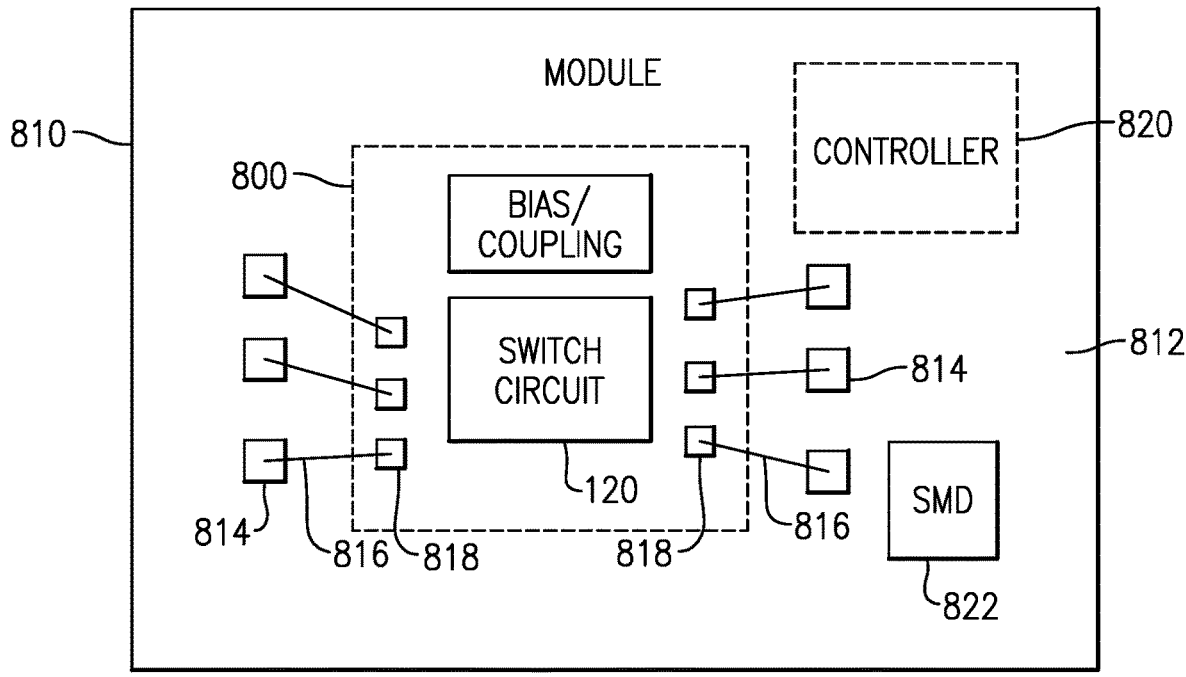
FIGS. 26A and 26B show that one or more die having one or more features described herein can be implemented in a packaged module.

In some embodiments, one or more die having one or more features described herein can be implemented in a packaged module. An example of such a module is shown in FIGS. 26A (plan view) and 26B (side view). Although described in the context of both of the switch circuit and the bias/coupling circuit being on the same die (e.g., example configuration of FIG. 25A), it will be understood that packaged modules can be based on other configurations.

A module 810 is shown to include a packaging substrate 812. Such a packaging substrate can be configured to receive a plurality of components, and can include, for example, a laminate substrate. The components mounted on the packaging substrate 812 can include one or more dies. In the example shown, a die 800 having a switching circuit 120 and a bias/coupling circuit 150 is shown to be mounted on the packaging substrate 812. The die 800 can be electrically connected to other parts of the module (and with each other where more than one die is utilized) through connections such as connection-wirebonds 816. Such connection-wirebonds can be formed between contact pads 818 formed on the die 800 and contact pads 814 formed on the packaging substrate 812. In some embodiments, one or more surface mounted devices (SMDs) 822 can be mounted on the packaging substrate 812 to facilitate various functionalities of the module 810.

In some embodiments, the packaging substrate 812 can include electrical connection paths for interconnecting the various components with each other and/or with contact pads for external connections. For example, a connection path 832 is depicted as interconnecting the example SMD 822 and the die 800. In another example, a connection path 832 is depicted as interconnecting the SMD 822 with an external-connection contact pad 834. In yet another example a connection path 832 is depicted as interconnecting the die 800 with ground-connection contact pads 836.

In some embodiments, a space above the packaging substrate 812 and the various components mounted thereon can be filled with an overmold structure 830. Such an overmold structure can provide a number of desirable functionalities, including protection for the components and wirebonds from external elements, and easier handling of the packaged module 810.

Figure 26B:
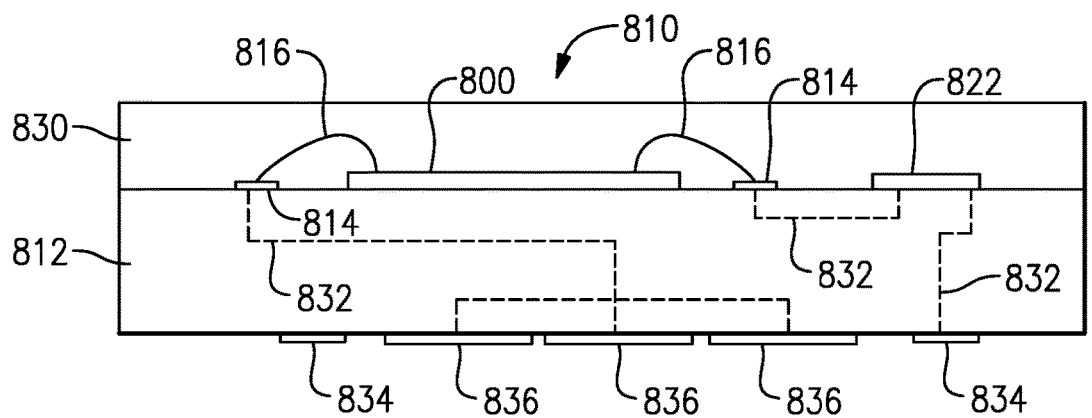
Figure 27:
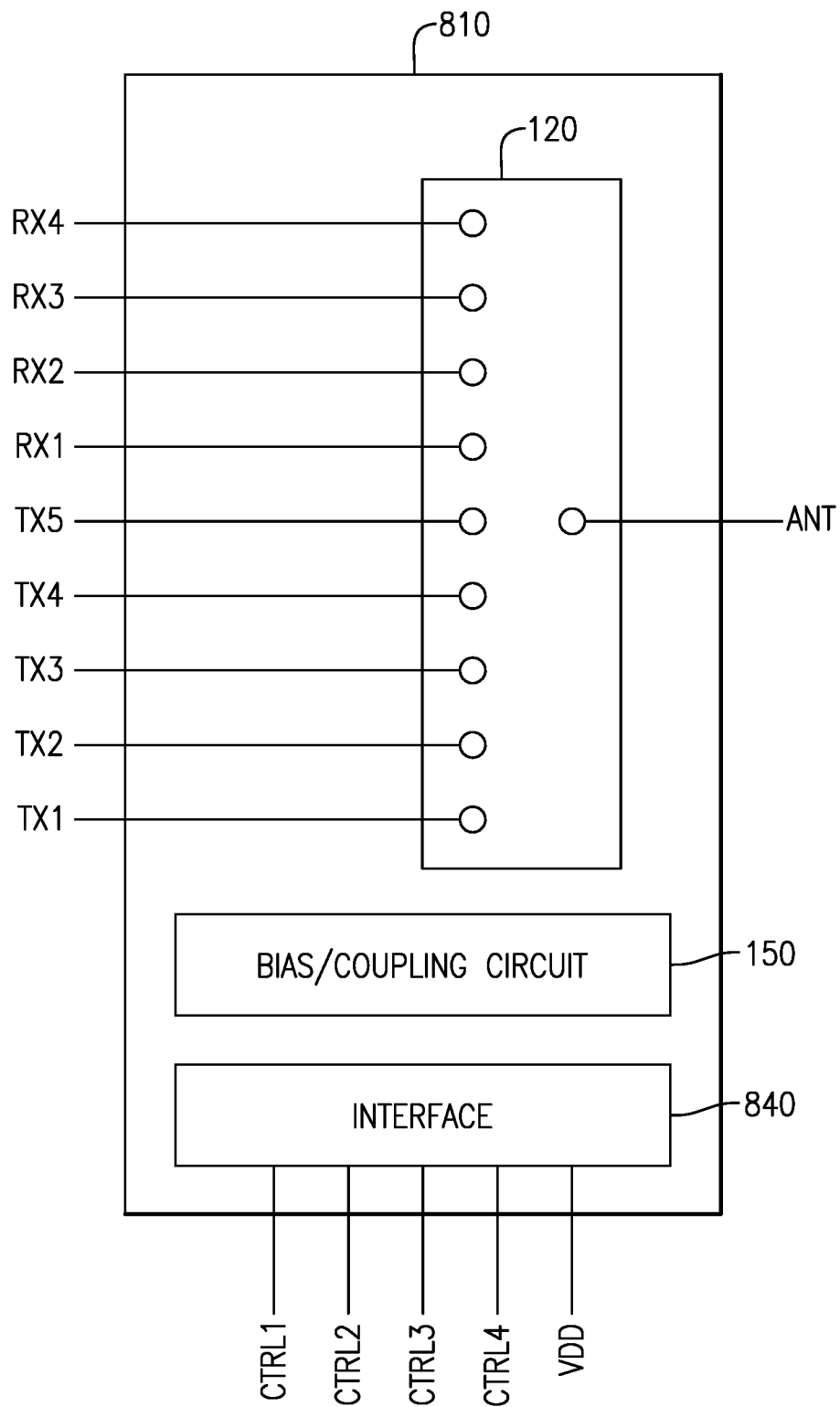
FIG. 27 shows a schematic diagram of an example switching configuration that can be implemented in a module such as the example of FIGS. 26A and 26B.

FIG. 27 shows a schematic diagram of an example switching configuration that can be implemented in the module 810 described in reference to FIGS. 26A and 26B. In the example, the switch circuit 120 is depicted as being an SP9T switch, with the pole being connectable to an antenna and the throws being connectable to various Rx and Tx paths. Such a configuration can facilitate, for example, multi-mode multi-band operations in wireless devices.

The module 810 can further include an interface for receiving power (e.g., supply voltage VDD) and control signals to facilitate operation of the switch circuit 120 and/or the bias/coupling circuit 150. In some implementations, supply voltage and control signals can be applied to the switch circuit 120 via the bias/coupling circuit 150.

Wireless Device Implementation

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 28:
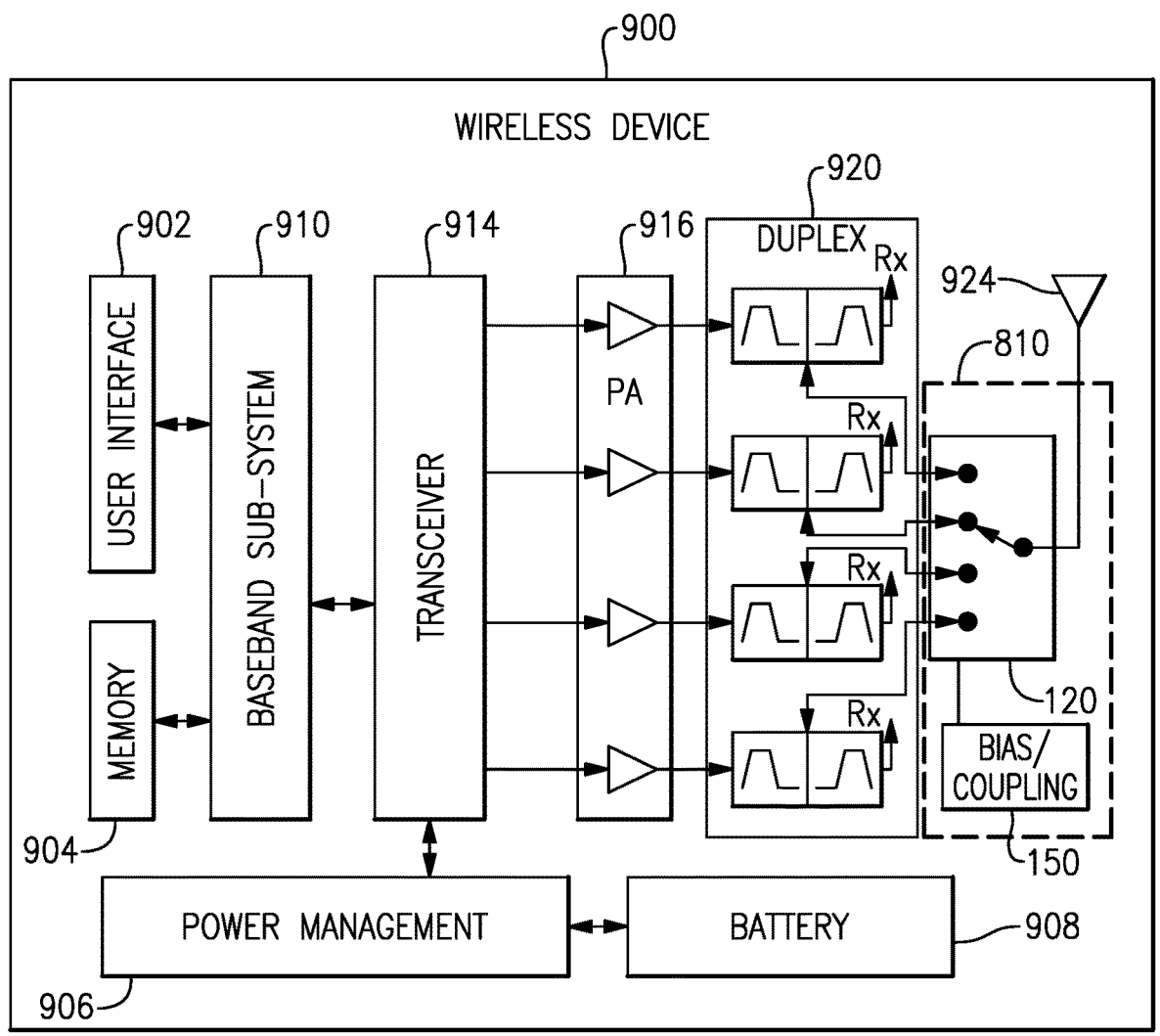
FIG. 28 depicts an example wireless device having one or more advantageous features described herein.

FIG. 28 schematically depicts an example wireless device 900 having one or more advantageous features described herein. In the context of various switches and various biasing/coupling configurations as described herein, a switch 120 and a bias/coupling circuit 150 can be part of a module 810. In some embodiments, such a switch module can facilitate, for example, multi-band multi-mode operation of the wireless device 900.

In the example wireless device 900, a power amplifier (PA) module 916 having a plurality of PAs can provide an amplified RF signal to the switch 120 (via a duplexer 920), and the switch 120 can route the amplified RF signal to an antenna. The PA module 916 can receive an unamplified RF signal from a transceiver 914 that can be configured and operated in known manners. The transceiver can also be configured to process received signals. The transceiver 914 is shown to interact with a baseband sub-system 910 that is configured to provide conversion between data and/or voice signals suitable for a user and RF signals suitable for the transceiver 914. The transceiver 914 is also shown to be connected to a power management component 906 that is configured to manage power for the operation of the wireless device 900. Such a power management component can also control operations of the baseband sub-system 910 and the module 810.

The baseband sub-system 910 is shown to be connected to a user interface 902 to facilitate various input and output of voice and/or data provided to and received from the user. The baseband sub-system 910 can also be connected to a memory 904 that is configured to store data and/or instructions to facilitate the operation of the wireless device, and/or to provide storage of information for the user.

In some embodiments, the duplexer 920 can allow transmit and receive operations to be performed simultaneously using a common antenna (e.g., 924). In FIG. 28, received signals are shown to be routed to "Rx" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method for fabricating a switch device, the method comprising:
   forming a plurality of elements to include a first end element and a second end element; and
   connecting the elements in series between a first terminal and a second terminal, such that the first end element is electrically connected to the first terminal and the second end element is electrically connected to the second terminal, each element having a parameter such that the elements provide a distribution of parameter values that decreases in magnitude from the first end element for at least half of the elements to a minimum parameter value corresponding to an element between the first end element and the second end element, the minimum parameter value less than the parameter value of the second end element, the parameter value of the first end element greater than or equal to the parameter value of the second end element.

2. The method of claim 1 wherein the forming of the plurality of elements is tailored such that the distribution of parameter values provides a desired voltage drop profile among the connected elements.

3. The method of claim 2 wherein the desired voltage drop profile includes an approximately uniform voltage drop profile.

4. The method of claim 1 wherein the forming of the plurality of elements is tailored such that the distribution of parameter values provides a desired capacitance profile among the connected elements.

5. The method of claim 4 wherein the desired capacitance profile includes an approximately uniform capacitance profile.

6. The method of claim 1 wherein the forming of the plurality of elements includes forming a plurality of respective transistors each having an active region, a source contact, a drain contact and a gate formed on the active region.

7. The method of claim 6 wherein the forming of the transistors includes forming of respective silicon-on-insulator transistors.

8. The method of claim 6 wherein the forming of the transistors is tailored such that the parameter includes a width of the gate.

9. The method of claim 6 wherein the forming of the transistors includes forming each transistor to have a finger configuration such that the gate includes a number of rectangular shaped gate fingers, each gate finger being between a rectangular shaped source finger of the source contact and a rectangular shaped drain finger of the drain contact.

10. The method of claim 9 wherein the forming of the transistors is tailored such that the parameter includes a number of fingers associated with the gate.

11. The method of claim 1 wherein the forming of the plurality of elements includes forming a plurality of respective diodes.

12. The method of claim 1 wherein the forming of the plurality of elements includes forming a plurality of respective microelectromechanical systems (MEMS) devices.

13. The method of claim 1 wherein the forming of the plurality of elements is tailored such that the parameter value of the first end element is greater in magnitude than the parameter value of the second end element.

14. The method of claim 1 wherein the forming of the plurality of elements is tailored such that the parameter value of the first end element is approximately equal in magnitude to the parameter value of the second end element.

15. The method of claim 14 wherein the distribution of parameter values is approximately symmetric.

16. A method for fabricating a semiconductor die, the method comprising:

providing or forming a semiconductor substrate; and implementing a circuit on the semiconductor substrate, the implementing of the circuit including forming a plurality of elements to include a first end element and a second end element, the implementing of the circuit further including electrically connecting the elements in series between a first terminal and a second terminal, such that the first end element is electrically connected to the first terminal and the second end element is electrically connected to the second terminal, and such that each element has a parameter such that the elements provide a distribution of parameter values that decreases in magnitude from the first end element for at least half of the elements to a minimum parameter value corresponding to an element between the first end element and the second end element, the minimum parameter value less than the parameter value of the second end element, the parameter value of the first end element greater than or equal to the parameter value of the second end element.

17. The method of claim 16 wherein the providing or forming of the semiconductor substrate includes providing or forming a silicon-on-insulator substrate.

18. The method of claim 17 wherein the forming of the plurality of elements of the circuit includes forming of a plurality of respective transistors, a plurality of respective diodes, or a plurality of microelectromechanical systems (MEMS) devices, on the silicon-on-insulator substrate.

19. The method of claim 16 wherein the circuit implemented on the semiconductor substrate includes a switch circuit.

20. A method for fabricating a radio-frequency module, the method comprising:

providing or forming a packaging substrate; and implementing a circuit on the packaging substrate, such that the circuit includes a plurality of elements having a first end element and a second end element, the circuit further including the elements electrically connected in series between a first terminal and a second terminal, such that the first end element is electrically connected to the first terminal and the second end element is electrically connected to the second terminal, and such that each element has a parameter, the elements providing a distribution of parameter values that decreases in magnitude from the first end element for at least half of the elements to a minimum parameter value corresponding to an element between the first end element and the second end element, the minimum parameter value less than the parameter value of the second end element, the parameter value of the first end element greater than or equal to the parameter value of the second end element.

* * * * *